(12) United States Patent
Inoue et al.

(10) Patent No.: US 10,545,526 B2
(45) Date of Patent: Jan. 28, 2020

(54) CIRCUIT, DRIVING METHOD THEREOF, AND SEMICONDUCTOR DEVICE

(71) Applicant: Semiconductor Energy Laboratory Co., Ltd., Atsugi-shi, Kanagawa-ken (JP)

(72) Inventors: Hiroki Inoue, Kanagawa (JP); Yoshiyuki Kurokawa, Kanagawa (JP); Takashi Nakagawa, Kanagawa (JP); Fumika Akasawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 354 days.

(21) Appl. No.: 15/183,892

(22) Filed: Jun. 16, 2016

(65) Prior Publication Data

US 2016/0379564 A1 Dec. 29, 2016

(30) Foreign Application Priority Data

Jun. 25, 2015 (JP) ................................. 2015-127200

(51) Int. Cl.
*G05F 3/26* (2006.01)
(52) U.S. Cl.
CPC ..... *G05F 3/262* (2013.01); *G09G 2310/0272* (2013.01)
(58) Field of Classification Search
CPC combination set(s) only.
See application file for complete search history.

(56) References Cited

U.S. PATENT DOCUMENTS

| 8,482,974 | B2 | 7/2013 | Saito et al. |
| 9,135,880 | B2 | 9/2015 | Koyama |
| 2011/0199807 | A1* | 8/2011 | Saito ............... G11C 11/405 |
| | | | 365/72 |
| 2016/0064443 | A1 | 3/2016 | Inoue et al. |
| 2016/0064444 | A1 | 3/2016 | Inoue et al. |

(Continued)

FOREIGN PATENT DOCUMENTS

| JP | 2003-234624 A | 8/2003 |
| JP | 2011-187950 A | 9/2011 |
| JP | 2014-026390 A | 2/2014 |

OTHER PUBLICATIONS

JP2003-234624 Suetsugu Aug. 22, 2003 (Year: 2003).*

*Primary Examiner* — Van N Chow
(74) *Attorney, Agent, or Firm* — Fish & Richardson P.C.

(57) ABSTRACT

A circuit includes a current mirror circuit (CM circuit) including first and second transistors, a third transistor whose drain is electrically connected to a drain of the second transistor, a switch controlling the current output from the circuit, and first and second memory circuits. A reference current of the CM circuit is input to a drain of the first transistor; a current that is a copy of the reference current is output from the drain of the second transistor. When a current is output from the circuit, the reference current is not input to the CM circuit. A drain current corresponding to a voltage stored in the first memory circuit flows through the second transistor; a drain current corresponding to a voltage stored in the second memory circuit flows through the third transistor. The difference between the two drain currents corresponds to the output current of the circuit.

17 Claims, 19 Drawing Sheets

(56) References Cited

U.S. PATENT DOCUMENTS

| | | |
|---|---|---|
| 2016/0295152 A1 | 10/2016 | Kurokawa |
| 2017/0025415 A1 | 1/2017 | Kurokawa |
| 2017/0063351 A1 | 3/2017 | Kurokawa |

* cited by examiner

FIG. 2A
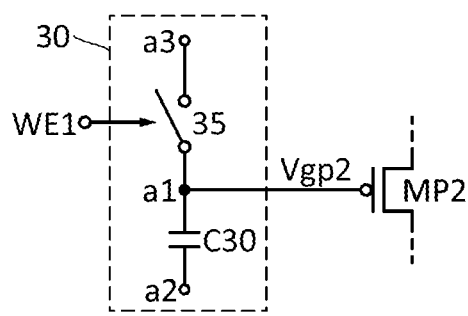
FIG. 2B  FIG. 2C  FIG. 2D
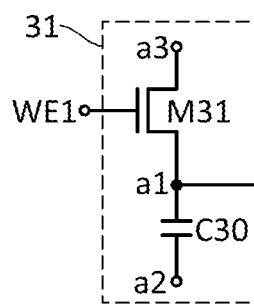 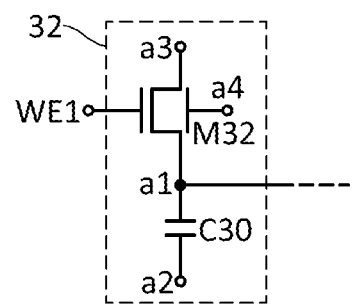 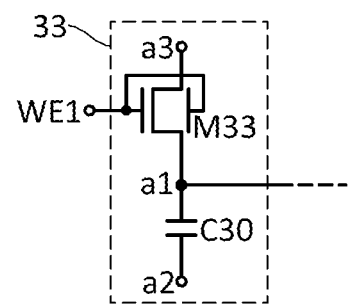

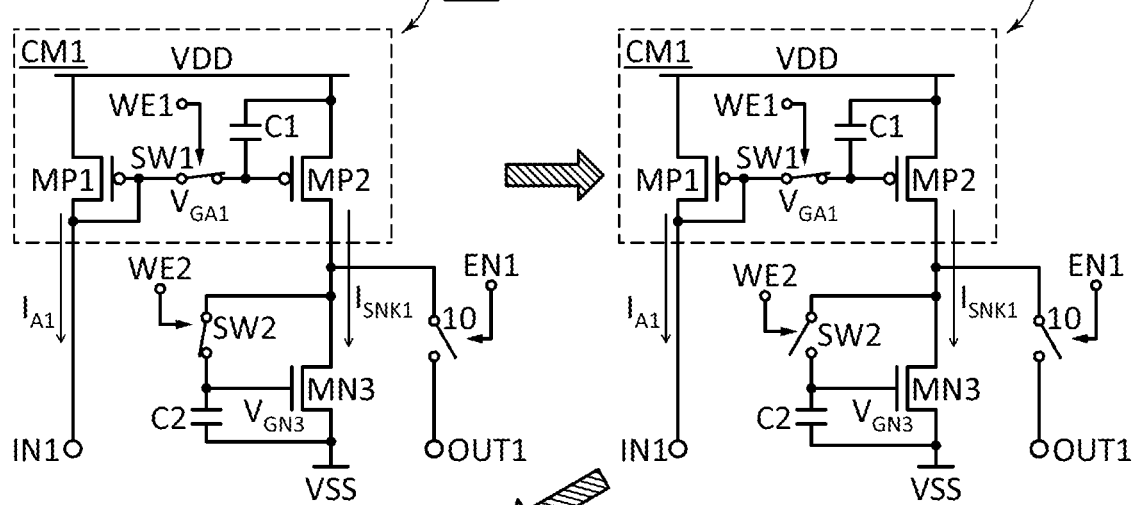
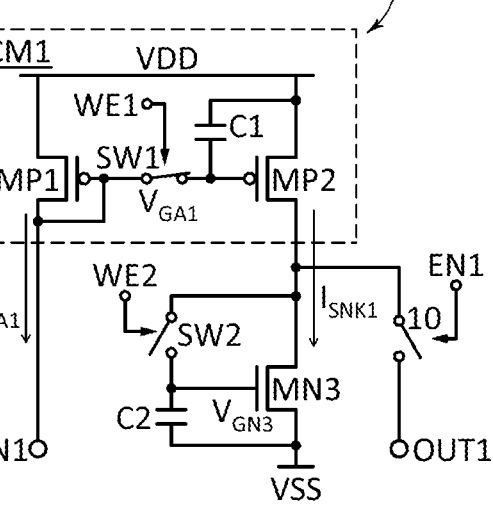
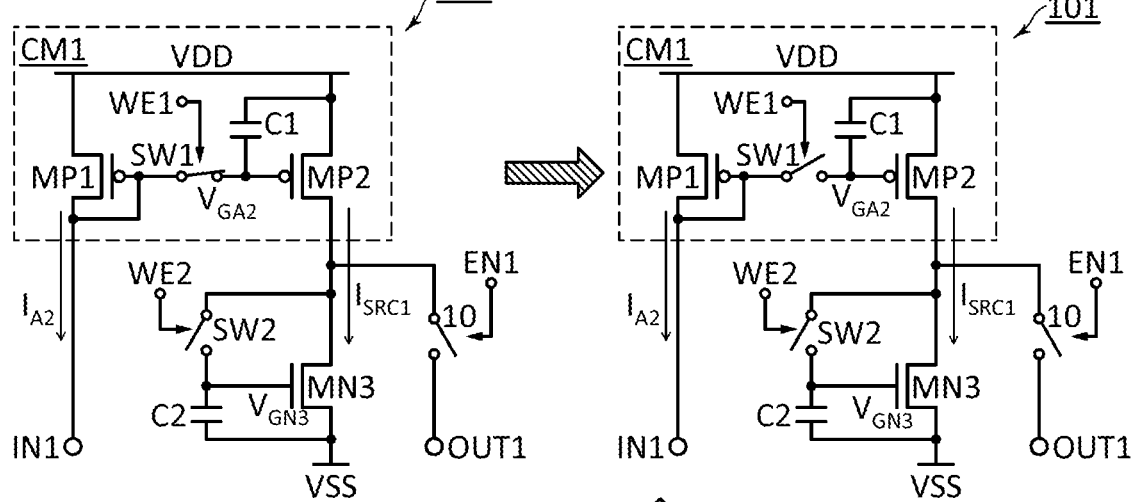
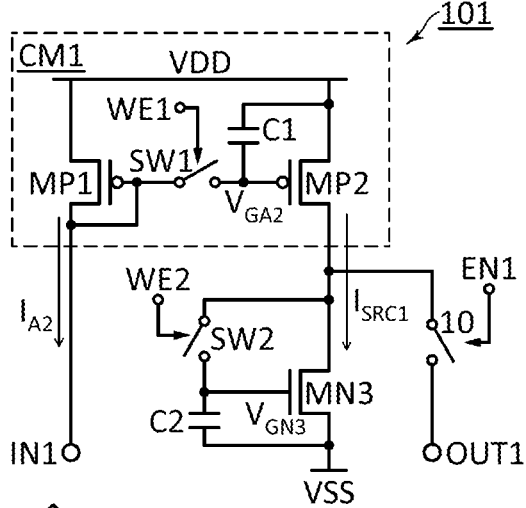
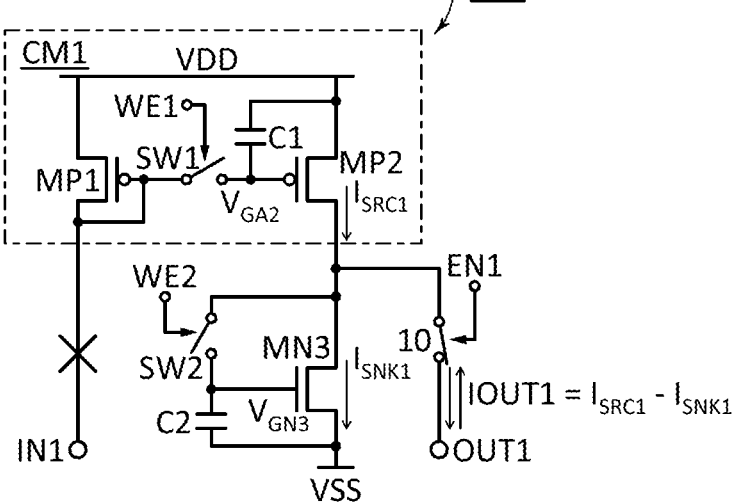

FIG. 16A
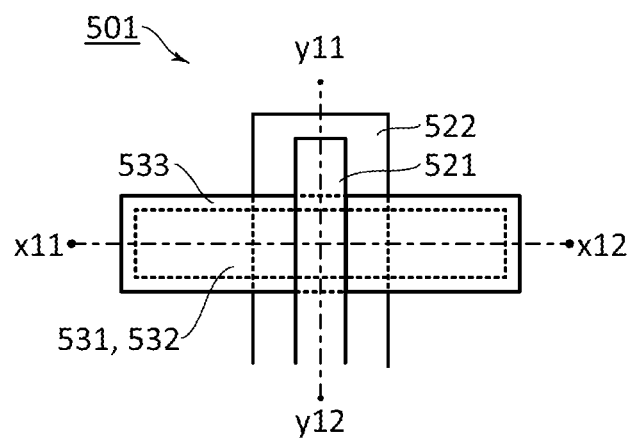
FIG. 16B
FIG. 16C
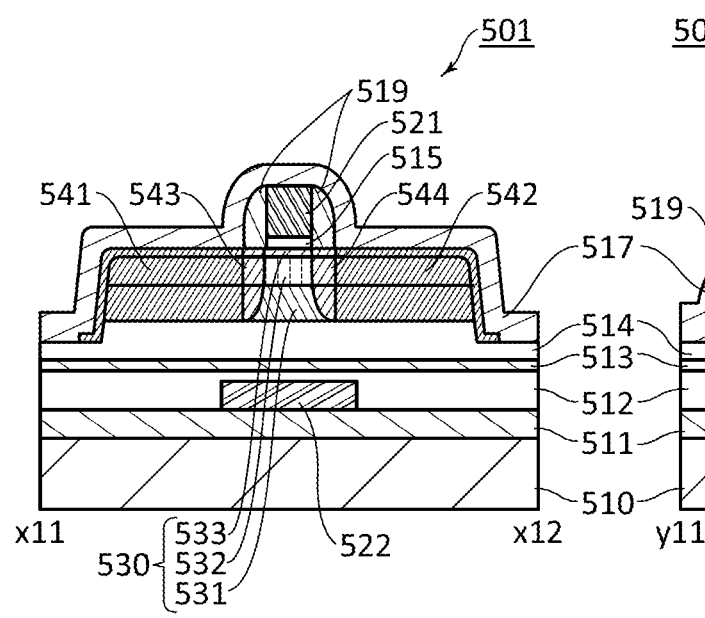
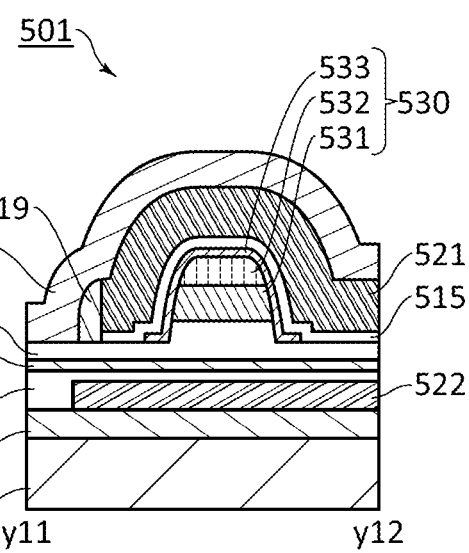

CIRCUIT, DRIVING METHOD THEREOF, AND SEMICONDUCTOR DEVICE

BACKGROUND OF THE INVENTION

1. Field of the Invention

The specification, the drawings, and the claims of the present application (hereinafter referred to as "this specification and the like") disclose a semiconductor device, an operation method thereof, and a manufacturing method thereof. Needless to say, embodiments of the present invention are not limited to the fields listed above.

In this specification and the like, a semiconductor device means a device that utilizes semiconductor characteristics and refers to a circuit including a semiconductor element (e.g., a transistor, a diode, or a photodiode), a device including the circuit, and the like. The semiconductor device also means any device that can function by utilizing semiconductor characteristics. For example, an integrated circuit, a chip including an integrated circuit, an electronic component including a packaged chip, and an electronic device including an integrated circuit are examples of a semiconductor device. Furthermore, a memory device, a display device, a light-emitting device, a lighting device, an imaging device, and the like themselves are semiconductor devices. These semiconductor devices each further include a semiconductor device in some cases.

2. Description of the Related Art

A basic current source circuit of a CMOS circuit can include a current mirror. A current source circuit (source current source) can be formed using a current mirror circuit including p-channel transistors (PMOS current mirror circuit); a current sink circuit (sink current source) can be formed using a current mirror circuit including n-channel transistors (NMOS current mirror circuit). In this specification, a p-channel transistor and an n-channel transistor are referred to as PMOS and NMOS, respectively, for convenience.

For example, Patent Document 1 discloses a current amplifier circuit which can selectively output a source current that is set in a PMOS current mirror circuit or a sink current that is set in an NMOS current mirror circuit and whose output current level can be changed in accordance with an input signal.

A variety of semiconductor devices that take advantage of an extremely low off-state current of a transistor whose channel formation region includes an oxide semiconductor (hereinafter, the transistor is referred to as an oxide semiconductor transistor or an OS transistor) have been proposed. For example, Patent Document 2 discloses a memory circuit including an OS transistor.

REFERENCE

Patent Document

[Patent Document 1] Japanese Published Patent Application No. 2014-26390

[Patent Document 2] Japanese Published Patent Application No. 2011-187950

SUMMARY OF THE INVENTION

In the examples disclosed in Patent Documents 1 and 2, two current mirror circuits, that is, a PMOS current mirror circuit and an NMOS current mirror circuit, are used to output both a sink current and a source current. The current amplifier circuit in Patent Document 2 further includes a switch circuit for selecting a current mirror circuit to which a reference current is input and a switch circuit for selecting a current mirror circuit which outputs a current. Thus, a large number of transistors are used.

An object of an embodiment of the present invention is to provide a novel semiconductor device or a novel method for driving the semiconductor device. Typically, an object of an embodiment of the present invention is to provide a novel semiconductor device which can selectively output a sink current or a source current and whose output current value can be changed, a novel method for driving the semiconductor device, or the like. Another object of an embodiment of the present invention is to reduce the size or power consumption of a semiconductor device, to achieve power gating, or to provide a programmable circuit, for example.

Note that objects other than those listed above will be apparent from the description of the specification, drawings, and claims and could also each be an object of an embodiment of the present invention. Even when a plurality of objects is described, they do not preclude each other. One embodiment of the present invention does not necessarily achieve all the objects.

One embodiment of the present invention is a circuit including an output terminal, a current mirror circuit including a first transistor and a second transistor, a third transistor, a switch, a first memory circuit, and a second memory circuit. A first voltage is input to a first terminal of the first transistor and a first terminal of the second transistor. A second voltage is input to a first terminal of the third transistor. A reference current is input to a second terminal of the first transistor. A second terminal of the second transistor and a second terminal of the third transistor are electrically connected to each other. The switch is configured to control the electrical connection between the second terminal of the second transistor and the output terminal. A third voltage stored in the first memory circuit is input to a gate of the second transistor. A fourth voltage stored in the second memory circuit is input to a gate of the third transistor.

The above embodiment may have the following configuration: the first memory circuit includes a first capacitor and a fourth transistor; the first capacitor is electrically connected to the gate of the second transistor; the fourth transistor is configured to bring the gate of the second transistor into an electrically floating state; the second memory circuit includes a second capacitor and a fifth transistor; the second capacitor is electrically connected to the gate of the third transistor; and the fifth transistor is configured to bring the gate of the third transistor into an electrically floating state. Note that a channel formation region of the fourth transistor and a channel formation region of the fifth transistor may each include an oxide semiconductor.

One embodiment of the present invention is a method for driving (operating) the above circuit. The method includes a first step in which a gate voltage of the third transistor at the time when a first reference current is input to the second terminal of the first transistor is stored in the second memory circuit, a second step which follows the first step and in which a gate voltage of the second transistor at the time when a second reference current is input to the second terminal of the first transistor is stored in the first memory circuit, and a third step which follows the second step and in which, in a state in which the input of the reference current to the second terminal of the first transistor is stopped, the switch is turned on so that a current is output from the output terminal.

In this specification and the like, a description "X and Y are connected" means that X and Y are electrically connected, X and Y are functionally connected, and X and Y are directly connected. Accordingly, without being limited to a predetermined connection relation, for example, a connection relation other than that shown in a drawing or text is also possible. X and Y each denote an object (e.g., a device, an element, a circuit, a wiring, an electrode, a terminal, a conductive film, or a layer).

A transistor has three terminals: a gate, a source, and a drain. The gate is a control terminal for controlling the on/off state of the transistor. Functions of input/output terminals of the transistor depend on the type (n-type or a p-type) and the levels of voltages applied to the terminals, and one of the two terminals serves as a source and the other serves as a drain. Therefore, in this specification and the like, the terms "source" and "drain" can be used to denote the drain and the source, respectively. In this specification and the like, the two terminals other than the gate may also be referred to as a first terminal and a second terminal, a third terminal and a fourth terminal, or the like.

A node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, ordinal numbers such as "first", "second", and "third" may be used to show the order. Furthermore, ordinal numbers may be used to avoid confusion among components but do not limit the number or the order of components. For example, it is possible to replace "first" with "second" or "third" in the description of one embodiment of the invention.

Other matters regarding the description of this specification and the like will be described in Embodiment 5.

According to an embodiment of the present invention, a novel semiconductor device or a novel method for driving the semiconductor device. Typically, according to an embodiment of the present invention, a novel circuit which can selectively output a sink current or a source current and whose output current value can be changed, a novel method for driving the circuit, or the like can be provided. According to another embodiment of the present invention, the size or power consumption of a circuit can be reduced, power gating can be achieved, or a programmable circuit can be provided, for example.

The description of the plurality of effects does not preclude the existence of other effects. One embodiment of the present invention does not necessarily achieve all the effects described above. In one embodiment of the present invention, an object and an effect other than those described above and a novel feature will be apparent from the description of the specification and the drawings.

BRIEF DESCRIPTION OF THE DRAWINGS

FIGS. 2A to 2D are circuit diagrams each illustrating a configuration example of a memory circuit.

FIGS. 3A to 3E illustrate an example of the operation of the circuit in FIG. 1A.

FIG. 16A is a top view illustrating a structure example of a transistor, FIG. 16B is a cross-sectional view taken along line x11-x12 in FIG. 16A, and FIG. 16C is a cross-sectional view taken along line y11-y12 in FIG. 16A.

DETAILED DESCRIPTION OF THE INVENTION

Figure 1A:
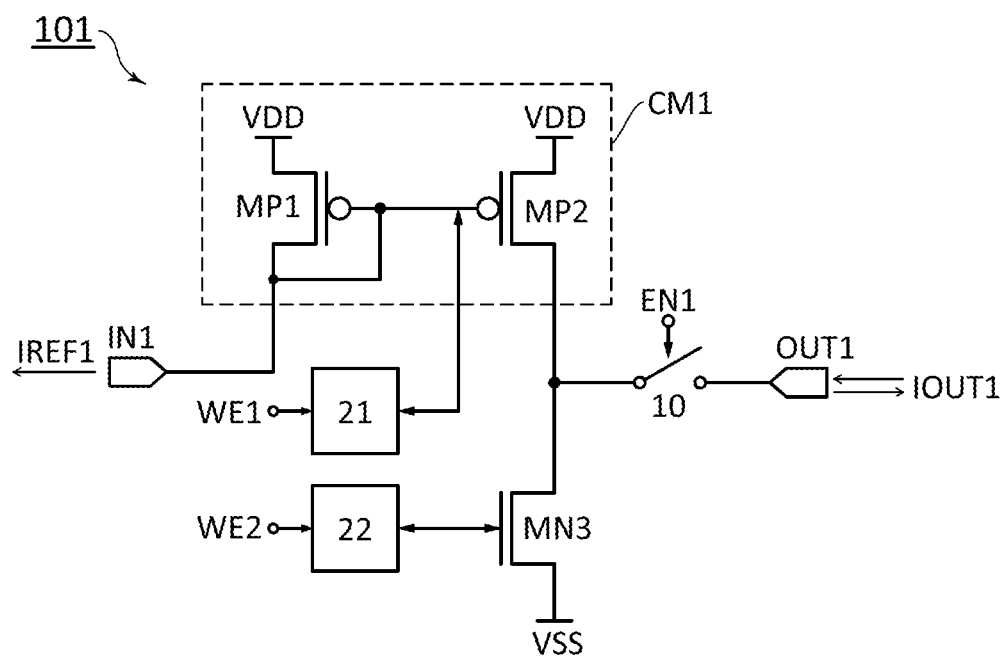
FIGS. 1A and 1B are block diagrams each illustrating a configuration example of a circuit.

Hereinafter, embodiments of the present invention will be described. Note that one embodiment of the present invention is not limited to the following description. It will be readily appreciated by those skilled in the art that modes and details of the present invention can be modified in various ways without departing from the spirit and scope of the present invention. Therefore, one embodiment of the present invention should not be construed as being limited to the description of the embodiments below.

Any of the embodiments described below can be combined as appropriate. When a plurality of structure examples (including examples of a manufacturing method, an operation method, and the like) is shown in one embodiment, any of the structure examples can be combined with each other or combined with one or more structure examples described in the other embodiments as appropriate.

In the drawings, the same elements, elements having similar functions, elements formed of the same material, elements formed at the same time, or the like are sometimes denoted by the same reference numerals, and description thereof is not repeated in some cases.

In this specification, a power supply voltage VDD may be abbreviated to a "voltage VDD" or "VDD", for example.

The same applies to other components (e.g., a signal, a voltage, a potential, a circuit, an element, an electrode, and a wiring).

(Embodiment 1)

Figure 1B:
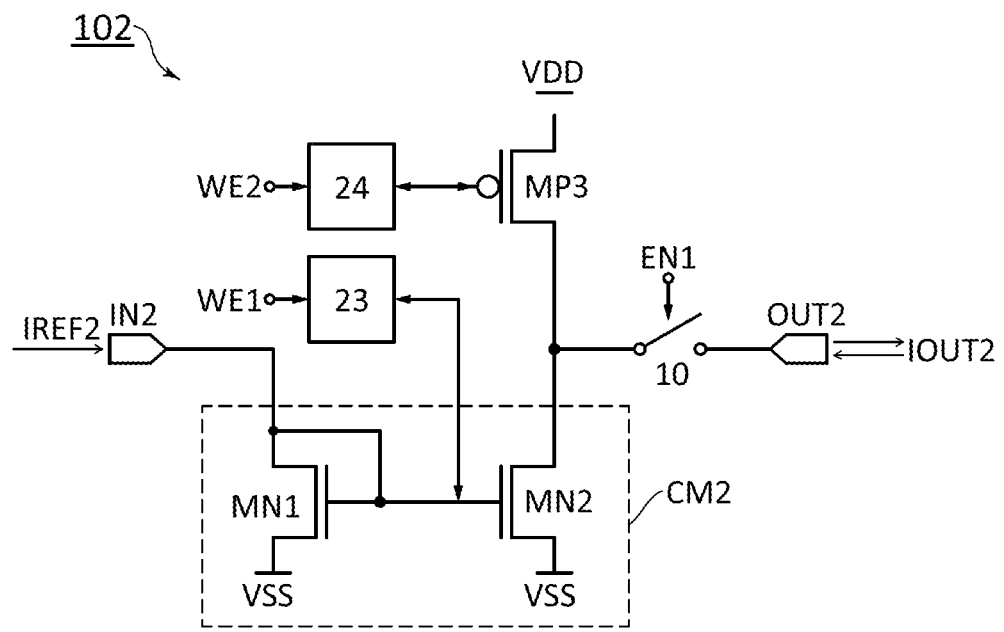

In this embodiment, a semiconductor device whose output current can be selected from a sink current and a source current and whose output current value can be changed will be described. FIGS. 1A and 1B illustrate configuration examples of such a semiconductor device.

<<Circuit 101>>

A circuit 101 illustrated in FIG. 1A includes a terminal IN1, a terminal OUT1, a switch 10, a current minor circuit CM1, a transistor MN3, a memory circuit 21, and a memory circuit 22. The current minor circuit CM1 (hereinafter referred to as "circuit CM1") includes transistors MP1 and MP2. The terminal IN1 and the terminal OUT1 are an input terminal and an output terminal, respectively, of the circuit 101. VDD and VSS are input to the circuit 101. Note that VDD and VSS are a high power supply voltage and a low power supply voltage, respectively, of the circuit 101.

The transistor MP1 is a monitor transistor (also referred to as a reference transistor), and the transistor MP2 is an output transistor (also referred to as a copier transistor). VDD is input to sources of the transistors MP1 and MP2. A drain of the transistor MP1 is electrically connected to the terminal IN1. A drain of the transistor MP2 is electrically connected to a drain of the transistor MN3 and is also electrically connected to the terminal OUT1 via the switch 10.

IREF1 is a current input to the terminal IN1 and serves as a reference current of the circuit CM1. Since the circuit CM1 is a PMOS current minor circuit, IREF1 is a sink current. When IREF1 is input to the drain of the transistor MP1, a current that is a copy of IREF1 flows through the transistor MP2.

IOUT1 is a current output from the terminal OUT1. The switch 10 controls the output of IOUT1. A signal EN1 is a control signal of the switch 10 and can be referred to as an output enable signal. The state in which the switch 10 is on corresponds to an output mode of the circuit 101.

VSS is input to a source of the transistor MN3. The drain of the transistor MN3 is electrically connected to the drain of the transistor MP2 and is also electrically connected to the terminal OUT1 via the switch 10.

The circuit CM1 and the transistor MN3 are basic elements of the circuit 101 serving as a current source circuit. The current mirror circuit included in the circuit 101 is a PMOS current mirror circuit. Therefore, a switch circuit for selecting a current mirror circuit to which a reference current is input or a switch circuit for selecting a current mirror circuit which outputs a current is unnecessary, so that the number of elements in the circuit 101 can be reduced. Consequently, the size and power consumption of the circuit 101 can be reduced. As described in Embodiment 4 later, the size of the circuit 101 can be further reduced by stacking the memory circuits 21 and 22 over a region in which the circuit CM1 and the transistor MN3 are formed.

The memory circuit 21 is a circuit for storing the gate voltage of the transistor MP2, and the memory circuit 22 is a circuit for storing the gate voltage of the transistor MN3. A signal WE1 is a control signal of the memory circuit 21, and a signal WE2 is a control signal of the memory circuit 22. Examples of a memory circuit that can be used as the memory circuit 21 will be described with reference to FIGS. 2A to 2D. Any of the memory circuits described below can also be used as the memory circuit 22.

FIG. 2A illustrates a configuration example of a memory circuit. A memory circuit 30 in FIG. 2A includes nodes a1 to a3, a capacitor C30, and a switch 35. Note that FIG. 2A represents an example in which the memory circuit 30 is used as the memory circuit 21.

The node a1 is electrically connected to the gate of the transistor MP2. The node a2 is electrically connected to a wiring (or an electrode) included in the circuit 101. Alternatively, a fixed potential is input to the node a2. The node a3 has a configuration similar to that of the node a2.

The capacitor C30 is a storage capacitor for holding Vgp2. A first terminal and a second terminal of the capacitor C30 are electrically connected to the node a1 and the node a2, respectively. The switch 35 controls the electrical connection between the node a1 and the node a3. The on/off of the switch 35 is controlled by the signal WE1. The memory circuit 30 is configured such that the node a1 is in an electrically floating state when the switch 35 is off.

FIGS. 2B to 2D illustrate specific circuit configuration examples of the memory circuit 30. When a circuit including a small number of elements is used as the switch 35, the size and power consumption of the circuit 101 can be reduced. To increase the retention time of the memory circuit 30, the amount of change in the voltage of the node a1 in a period in which the switch 35 is off is preferably reduced as much as possible. For example, these objects can be achieved by using one transistor with an extremely low off-state current as the switch 35.

An extremely low off-state current means a normalized off-state current per micrometer of channel width of $10 \times 10^{-21}$ A (10 zeptoampere (zA)) or lower at a source-drain voltage of 3 V at room temperature. A transistor whose channel formation region is formed using a wide-bandgap semiconductor can have an extremely low off-state current. Examples of a wide-bandgap semiconductor (typically a semiconductor with a bandgap of 2.2 eV or more) include an oxide semiconductor, silicon carbide, gallium nitride, and diamond.

A typical oxide semiconductor has a bandgap of 3.0 eV or more; thus, an OS transistor has a low leakage current due to thermal excitation and an extremely low off-state current. A channel formation region of an OS transistor is preferably formed using an oxide semiconductor containing at least one of indium (In) and zinc (Zn). Typical examples of such an oxide semiconductor include an In-M-Zn oxide (the element M is Al, Ga, Y, or Sn, for example). By reducing impurities serving as electron donors, such as moisture or hydrogen, and reducing oxygen vacancies, an i-type (intrinsic) or a substantially i-type oxide semiconductor can be obtained. Here, such an oxide semiconductor can be referred to as a highly-purified oxide semiconductor. By using a highly purified oxide semiconductor, the off-state current of the OS transistor which is normalized by the channel width can be as low as several yoctoamperes per micrometer to several zeptoamperes per micrometer. For example, the off-state current of the OS transistor which is normalized by the channel width per micrometer at a source-drain voltage of 10 V can be lower than or equal to $10 \times 10^{-21}$ A (10 zA). An OS transistor and an oxide semiconductor will be described in Embodiments 4 and 5.

In a memory circuit 31 illustrated in FIG. 2B, a transistor M31 is used as the switch 35. The transistor M31 is preferably the above-described transistor with an extremely low off-state current. The signal WE1 is input to a gate of the transistor M31. A first terminal and a second terminal of the transistor M31 are electrically connected to the node a1 and the node a3, respectively. The transistor M31 is a path transistor that controls the electrical connection between the node a1 and the node a3. By turning on the transistor M31, the voltage of the node a3 is written to the node a1 (the gate of the transistor MP2). By turning off the transistor M31, the node a1 is brought into an electrically floating state; thus, the voltage of the node a1 is held by the capacitor C30.

A memory circuit 32 illustrated in FIG. 2C is a modification example of the memory circuit 31. A transistor M32 having a back gate is provided instead of the transistor M31. The back gate of the transistor M32 is electrically connected to a node a4. The threshold voltage of the transistor M32 can be controlled by the voltage of the node a4. During the operation of the circuit 101, a fixed voltage such as VSS or a ground potential (GND) may be input to the node a4, or the voltage of the node a4 may be changed in accordance with the state of the circuit 101. A charge accumulation layer may be provided between the back gate and a channel formation region of the transistor M32. In this case, by inputting a voltage higher than that of a gate of the transistor M32 to the node a4, electrons can be injected into the charge accumulation layer of the transistor M32. The electron injection into the charge accumulation layer can shift the threshold voltage of the transistor M32 to the positive voltage side. Accordingly, the leakage current of the transistor M32 is reduced.

A memory circuit 33 illustrated in FIG. 2D is a modification example of the memory circuit 31. A transistor M33 having a back gate is provided instead of the transistor M31. Although electrically connected to a gate (front gate) in the example in FIG. 2D, the back gate of the transistor M33 may be electrically connected to a source or a drain.

An example of the switch 10 is, but not particularly limited to, a CMOS switch such as a transmission gate. Alternatively, like the switch 35 in the memory circuit 30, a transistor including a wide-bandgap semiconductor (e.g., OS transistor) may be used as the switch 10.

<<Example of Operation Method of Circuit 101>>

An example of an operation method of the circuit 101 will be described. The circuit 101 has at least the following three operation modes.

[A1]: A mode of storing data on a current $I_{SNK1}$ which flows through the transistor MN3 when a current $I_{A1}$ is input to the terminal IN1.

[A2]: A mode of storing data on a current $I_{SRC1}$ which flows through the transistor MP2 when a current $I_{A2}$ is input to the terminal IN1.

[A3]: A mode of outputting IOUT1 from the terminal OUT1.

The mode A1 can be referred to as a current storage mode. By being executed in the mode A1, the circuit 101 is configured such that the current $I_{SNK1}$ flows through the transistor MP2; therefore, the mode A1 can also be referred to as a configuration mode. In the mode A1, configuration data of the circuit 101 is stored in the memory circuit 22.

The mode A2 can also be referred to as a current storage mode or a configuration mode. The mode A2 is a mode for configuring the circuit 101 such that the current $I_{SRC1}$ flows through the transistor MP2. In the mode A2, configuration data of the circuit 101 is stored in the memory circuit 21.

The mode A3 is an output mode. IOUT1 depends on the configuration data stored in the memory circuits 21 and 22. In other words, the configuration data determines the current value of IOUT1 and whether IOUT1 is a sink current or a source current.

FIGS. 3A to 3E are circuit diagrams illustrating an example of the operation of the circuit 101. In FIGS. 3A to 3E, a capacitor C1 and a switch SW1 (hereinafter referred to as SW1) are components of the memory circuit 21, and a capacitor C2 and a switch SW2 (hereinafter referred to as SW2) are components of the memory circuit 22. A first terminal of the capacitor C1 is electrically connected to the gate of the transistor MP2, and VDD is input to a second terminal of the capacitor C1. SW1 controls the electrical connection and isolation between the gate of the transistor MP1 and the gate of the transistor MP2. A first terminal of the capacitor C2 is electrically connected to the gate of the transistor MN3, and VSS is input to a second terminal of the capacitor C2. SW2 controls the electrical connection and isolation between the gate and the drain of the transistor MN3.

(Mode A1)

FIGS. 3A and 3B illustrate the mode A1. $I_{A1}$ and $I_{SNK1}$ each denote a current. $I_{A1}$ is an input current of the circuit 101 and a reference current of the circuit CM1. $I_{SNK1}$ is an output current of the circuit CM1.

First, the circuit 101 is configured as illustrated in FIG. 3A. The switch 10 is turned off by the signal EN1. SW1 and SW2 are turned on by the signals WE1 and WE2. $I_{A1}$ is input to the terminal IN1. Note that $I_{A1}$ is a sink current. In the circuit CM1, when $I_{A1}$ flows between the source and the drain of the transistor MP1, the gate voltage of the transistor MP1 becomes $V_{GA1}$, and the gate voltage of the transistor MP2 also becomes $V_{GA1}$. $I_{SNK1}$ which corresponds to the gate-source voltage ($V_{GA1}$-VDD) of the transistor MP2 flows between the source and the drain thereof. The current value of $I_{SNK1}$ is proportional to that of $I_{A1}$, where the proportionality coefficient depends on the element size (the channel length and the channel width) of each of the transistors MP1 and MP2. Specifically, $I_{SNK1}$ and $I_{A1}$ have the following relation:

$I_{SNK1}=((\beta_{P2}/\beta_{P1})I_{A1}$, where $\beta_{P1}$ denotes the channel width of the transistor MP1/the channel length of the transistor MP1, and $\beta_{P2}$ denotes the channel width of the transistor MP2/the channel length of the transistor MP2.

The drain-source current (hereinafter drain current) of the transistor MN3 is equal to the drain current of the transistor MP2, that is, $I_{SNK1}$. The gate voltage of the transistor MN3 supplied with $I_{SNK1}$ is $V_{GN3}$.

Next, the circuit 101 is configured as illustrated in FIG. 3B. That is, SW2 is turned off by the signal WE2. Consequently, the gate of the transistor MN3 is brought into an electrically floating state, so that $V_{GN3}$ (the gate voltage of the transistor MN3) is held by the capacitor C2. The mode A2 follows the mode A1.

(Mode A2)

FIGS. 3C and 3D illustrate the mode A2. Like $I_{A1}$, $I_{A2}$ is an input current of the circuit 101 and a reference current of the circuit CM1. Like $I_{SNK1}$, $I_{SRC1}$ is an output current of the circuit CM1. $I_{SRC1}$ and $I_{A2}$ have the following relation:

$I_{SRC1}=(\beta_{P2}/\beta_{P1})I_{A2}.$

In the state where the circuit 101 keeps the circuit configuration in FIG. 3B, $I_{A2}$ is input to the terminal IN1 (FIG. 3C). The circuit CM1 outputs $I_{SRC1}$. When $I_{A2}$ is input, the gate voltage of each of the transistors MP1 and MP2 becomes $V_{GA2}$. Subsequently, SW1 is turned off by the signal WE1 so that the gate voltage of the transistor MP2 is retained (FIG. 3D). The gate of the transistor MP2 is brought into an electrically floating state, so that $V_{GA2}$ is held by the capacitor C1.

(Mode A3)

FIG. 3E illustrates the mode A3. When IOUT1 is output from the terminal OUT1, no current is input to the terminal IN1. The switch 10 is turned on by the signal EN1, so that the circuit 101 can output IOUT1. Since the gate voltage of the transistor MN3 is $V_{GN3}$, $I_{SNK1}$ flows between the source and the drain of the transistor MN3. Since the gate voltage of the transistor MP2 is $V_{GA2}$, $I_{SRC1}$ flows between the source and the drain of the transistor MP2. Thus, IOUT1 equals to $I_{SRC1}$-$I_{SNK1}$. IOUT1 is a source current when $I_{SRC1}$ is higher than $I_{SNK1}$ and is a sink current when $I_{SRC1}$ is lower than $I_{SNK1}$.

By setting the value of the input current ($I_{A1}$) of the circuit 101 in the mode A1 and the value of the input current ($I_{A2}$) of the circuit 101 in the mode A2, the value of IOUT1 can be set and whether IOUT1 is a sink current or a source current can be selected. As described above, the circuit 101 is a programmable circuit configured to operate in the modes A1 and A2 to output a desired IOUT.

As illustrated in FIG. 3E, the circuit 101 can output IOUT even when no reference current is input to the circuit CM1. That is, the power consumption of the circuit 101 in operation can be reduced. Moreover, the circuit 101 can retain the gate voltages of the transistors MP2 and MN3 without being supplied with VDD or VSS. Therefore, VDD may be supplied to the circuit 101 only when IOUT1 needs to be output. Accordingly, the supply of VDD and/or VSS can be stopped by power gating in a period in which the circuit 101 does not need to operate. In this manner, the standby power of the circuit 101 can be effectively reduced.

<<Circuit 102>>

The circuit 101 is an example of a circuit whose input current is a sink current. In the case where the input signal is a source current, an NMOS current mirror circuit may be used as a current mirror circuit and a p-channel transistor may be used as an output transistor corresponding to the transistor MN3. FIG. 1B illustrates an example of such a circuit.

A circuit 102 illustrated in FIG. 1B includes a terminal IN2, a terminal OUT2, a current mirror circuit CM2 (hereinafter referred to as "circuit CM2"), a transistor MP3, the switch 10, a memory circuit 23, and a memory circuit 24. The terminal IN2 and the terminal OUT2 are an input terminal and an output terminal, respectively, of the circuit 102. The circuit CM2 includes transistors MN1 and MN2. VSS is input to sources of the transistors MN1 and MN2, and VDD is input to a source of the transistor MP3.

IREF2 is an input current of the circuit 102 and a reference current of the circuit CM2. Since the circuit CM2 is an NMOS current mirror circuit, IREF2 is a source current. IOUT2 is an output current of the circuit 102. The value of IOUT2 and whether IOUT2 is a source current or a sink current are determined by data stored in the memory circuits 23 and 24. The memory circuit 23 is a circuit for storing the gate voltage of the transistor MN2, and the memory circuit 24 is a circuit for storing the gate voltage of the transistor MP3. Each of the memory circuits 23 and 24 has a configuration similar to that of the memory circuit 30.

The circuit 102 can operate in a manner similar to that of the circuit 101. The description of the configuration, operation, effect, and the like of the circuit 102 will be omitted, for which refer to the description of FIG. 1A, FIGS. 2A to 2D, and FIGS. 3A to 3E.

Specific circuit configuration examples of the circuits 101 and 102 will be described below. A circuit 111 (FIG. 4A) and a circuit 112 (FIG. 4B) each correspond to the circuit 101 and include a PMOS current mirror circuit. A circuit 121 (FIG. 6A) and a circuit 122 (FIG. 6B) each correspond to the circuit 102 and include an NMOS current mirror circuit. FIG. 5 is a timing chart of the circuits 111 and 112, and FIG. 7 is a timing chart of the circuits 121 and 122.

<<Circuit 111>>

Figure 4A:
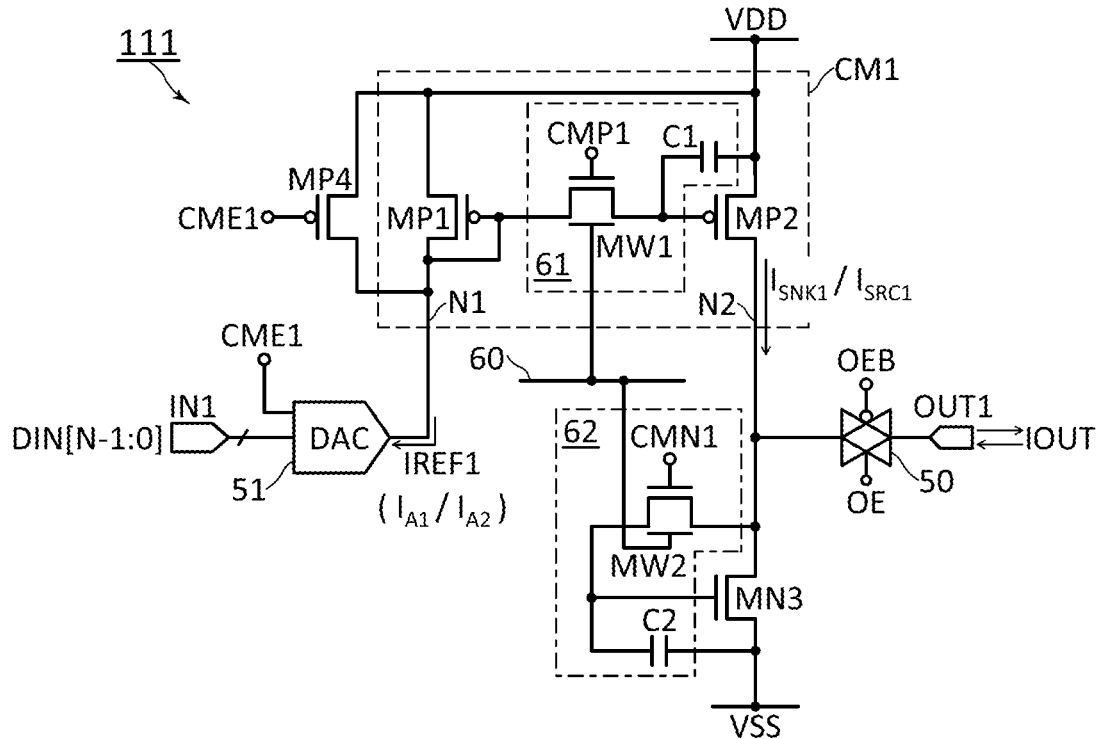
FIGS. 4A and 4B are circuit diagrams each illustrating a configuration example of a circuit.
Figure 5:
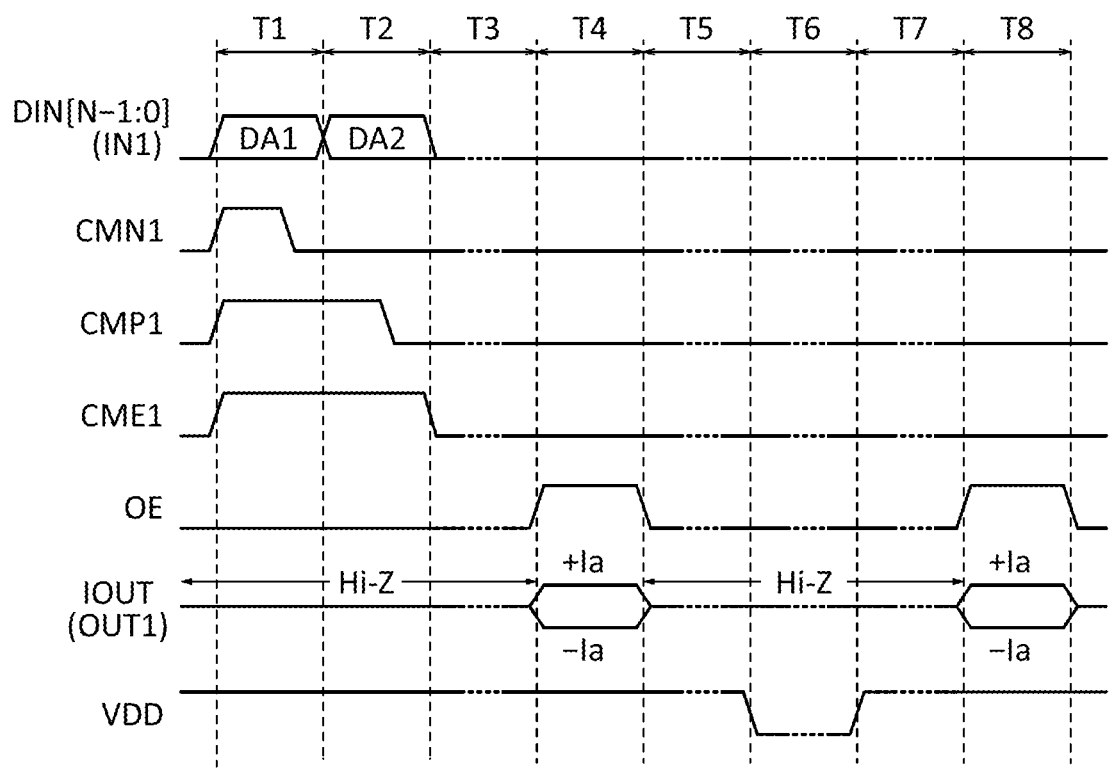
FIG. 5 is a timing chart illustrating an example of the operation of the circuits in FIGS. 4A and 4B.

The circuit 111 in FIG. 4A has a function of generating an analog current by processing a digital signal. The value of the analog current and whether the analog current is a sink current or a source current are determined by the input digital signal. This digital signal is denoted by DIN[N-1:0] and has N bits (N is an integer greater than 1). IOUT is an analog current serving as an output current of the circuit 111. The above description also applies to the circuits 112, 121, and 122.

The circuit 111 includes the terminals IN1 and OUT1, nodes N1 and N2, a transmission gate (TG) 50, a digital-analog converter circuit (DAC) 51, transistors MP1, MP2, MP4, MN3, MW1, and MW2, and the capacitors C1 and C2. The circuit 111 is electrically connected to a power supply line which supplies VDD (hereinafter referred to as a VDD line), a power supply line which supplies VSS (hereinafter referred to as a VSS line), and a wiring 60. Signals CME1, CMP1, CMN1, OE, and OEB are input to the circuit 111. The signal OEB is an inverted signal of the signal OE.

The TG 50 is a circuit corresponding to the switch 10. The on/off of the TG 50 is controlled by the signals OE and OEB. In the example in FIG. 4A, the TG 50 is on when the signal OE is at the high (H) level and is off when the signal OE is at the low (L) level. Note that the signal OEB can also be generated inside the circuit 111. For example, an inverter circuit to which the signal OE is input may be provided in the circuit 111, and an output of the inverter circuit may be input to the TG 50.

The transistors MP1 and MP2 form the circuit CM1. The node N1 and the node N2 are an input node and an output node, respectively, of the circuit CM1.

A memory circuit 61 corresponds to the memory circuit 21 and includes the transistor MW1 and the capacitor C1. The transistor MW1 is a path transistor which controls the electrical connection between the gate of the transistor MP1 and the gate of the transistor MP2. The signal CMP1 controls the on/off of the transistor MW1. The first terminal of the capacitor C1 is electrically connected to the gate of the transistor MP2, and the second terminal of the capacitor C1 is electrically connected to the VDD line.

A memory circuit 62 which includes the transistor MW2 and the capacitor C2 corresponds to the memory circuit 22. The transistor MW2 is a path transistor which controls the electrical connection between the gate and the drain of the transistor MN3. The signal CMN1 controls the on/off of the transistor MW2. The first terminal of the capacitor C2 is electrically connected to the gate of the transistor MN3, and the second terminal of the capacitor C2 is electrically connected to the VSS line.

To increase the retention time of the gate voltage of the transistor MP2 in the memory circuit 61, the transistor MW1 is preferably a transistor including a wide-bandgap semiconductor, such as an OS transistor. The same applies to the transistor MW2.

Any of the memory circuits 31 to 33 (FIGS. 2B to 2D) can be used as the memory circuits 61 and 62. Here, the memory circuit 32 is used as each of the memory circuits 61 and 62. Thus, each of the transistors MW1 and MW2 has a back gate. Their back gates are electrically connected to the wiring 60. As mentioned above, during the operation of the circuit 111, the voltage of the wiring 60 may be fixed to VSS, GND, or the like or may be changed in accordance with the state of the circuit 111. In the case where charge accumulation layers are provided in the transistors MW1 and MW2, a high voltage may be input to the wiring 60 in the manufacturing process of the circuit 111 to inject electrons into the charge accumulation layers of the transistors MW1 and MW2. The back gate of the transistor MW2 may be electrically connected to a wiring different from the wiring 60. Thus, the back-gate voltage of the transistor MW1 and the back-gate voltage of the transistor MW2 can be separately controlled.

The DAC 51 is a circuit for generating a reference current (IREF1) of the circuit CM1. Since the circuit CM1 is a PMOS current mirror circuit, the DAC 51 generates a sink current. The DAC 51 has a function of converting a digital signal into an analog current. Specifically, the DAC 51 processes DIN[N-1:0] and outputs IREF1. The value of IREF1 is determined by the value of DIN[N-1:0]. The signal CME1 is a control signal of the DAC 51. The signal CME1 determines whether to activate or inactivate the DAC 51.

When the DAC 51 is inactive, the voltage of the node N1 is unstable. The transistor MP4 is provided to fix the voltage of the node N1 when the DAC 51 is inactive. The transistor MP4 may be provided as needed. For example, the transistor MP4 is not necessarily provided if the DAC 51 has a circuit configuration in which the voltage of the output terminal in an inactive state can be fixed.

A source of the transistor MP4 is electrically connected to the VDD line, and a drain of the transistor MP4 is electrically connected to the node N1. The signal CME1 controls the on/off of the transistor MP4. Here, when the signal CME1 is at the H-level, the DAC 51 is active and the transistor MP4 is off. In this state, IREF1 is input to the node N1. When the signal CME1 is at the L-level, the DAC 51 is inactive and the transistor MP4 is on. Thus, when the DAC 51 is inactive, the voltage of the node N1 is fixed to VDD by the transistor MP4.

<<Circuit 112>>

Figure 4B:
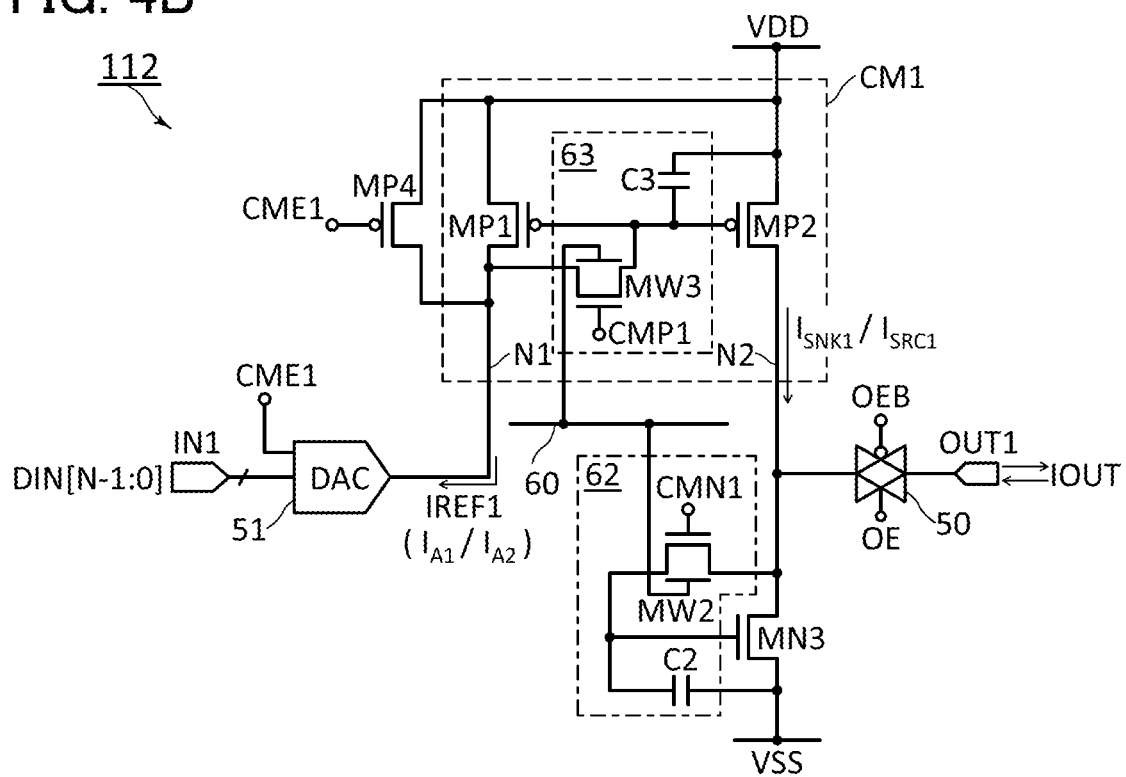

The circuit 112 in FIG. 4B is a modification example of the circuit 111. The circuit 112 is different from the circuit 111 in the circuit configuration of the memory circuit for storing the gate voltage of the transistor MP2. A memory circuit 63 in FIG. 4B corresponds to the memory circuit 61 in FIG. 4A. Any of the memory circuits 31 to 33 can be used as the memory circuit 63. Here, the memory circuit 32 is used as the memory circuit 63.

The memory circuit 63 includes a capacitor C3 and a transistor MW3. A first terminal of the capacitor C3 is electrically connected to the gate of the transistor MP2, and a second terminal of the capacitor C3 is electrically connected to the VDD line. The transistor MW3 is a path transistor which controls the electrical connection between the gate and the drain of the transistor MP1. The transistor MP1 is diode-connected when the transistor MW3 is on. The on/off of the transistor MW3 is controlled by the signal CMP1. The transistor MW3 may have a configuration similar to that of the transistor MW2.

<<Circuit 121>>

Figure 6A:
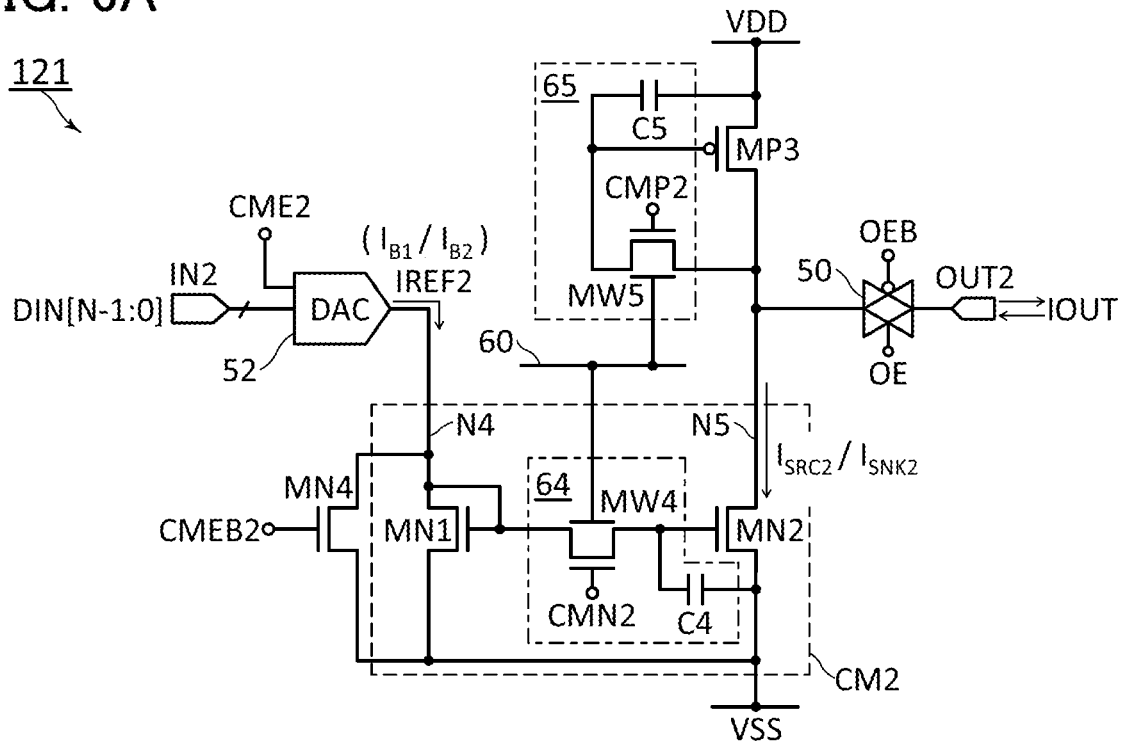
FIGS. 6A and 6B are circuit diagrams each illustrating a configuration example of a circuit.
Figure 7:
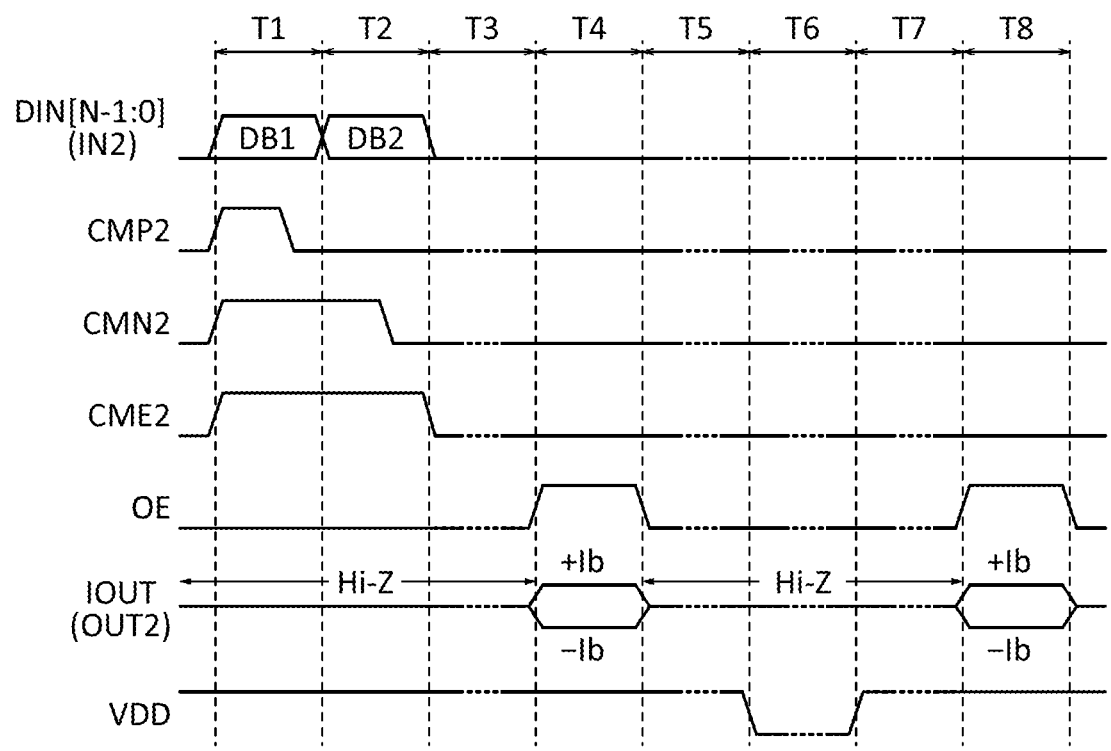
FIG. 7 is a timing chart illustrating an example of the operation of the circuits in FIGS. 6A and 6B.

The circuit 121 in FIG. 6A has a circuit configuration in which transistors have conductivity types opposite to those of the transistors MP1, MP2, MP4, and MN3 in the circuit 111. The circuit 121 includes the terminals IN2 and OUT2, nodes N4 and N5, the TG 50, a DAC 52, transistors MN1, MN2, MN4, MP3, MW4, and MW5, and capacitors C4 and C5. The circuit 121 is electrically connected to the VDD line, the VSS line, and the wiring 60. Signals CME2, CMEB2, CMN2, CMP2, OE, and OEB are input to the circuit 121.

The transistors MN1 and MN2 form an NMOS current mirror circuit (the circuit CM2). The node N4 and the node N5 are an input node and an output node, respectively, of the circuit CM2.

The DAC 52 is a circuit for generating a reference current (IREF2) input to the circuit CM2. Since the circuit CM2 is an NMOS current mirror circuit, the DAC 52 outputs a source current. In this case, the DAC 52 processes DIN[N-1:0] and outputs IREF2. The signal CME2 is a control signal of the DAC 52. The signal CME2 determines whether to activate or inactivate the DAC 52.

A memory circuit 64 corresponds to the memory circuit 23 and includes the capacitor C4 and the transistor MW4. A first terminal of the capacitor C4 is electrically connected to a gate of the transistor MN2, and a second terminal of the capacitor C4 is electrically connected to the VSS line. The transistor MW4 is a path transistor which controls the electrical connection between a gate of the transistor MN1 and the gate of the transistor MN2. The signal CMN2 controls the on/off of the transistor MW4.

A memory circuit 65 corresponds to the memory circuit 24 and includes the capacitor C5 and the transistor MW5. A first terminal of the capacitor C5 is electrically connected to a gate of the transistor MP3, and a second terminal of the capacitor C5 is electrically connected to the VDD line. The transistor MW5 is a path transistor which controls the electrical connection between the gate and a drain of the transistor MP3. The signal CMP2 controls the on/off of the transistor MW5.

Like the transistor MW1, each of the transistors MW4 and MW5 is preferably a transistor including a wide-bandgap semiconductor, such as an OS transistor. Here, each of the transistors MW4 and MW5 has a back gate which is electrically connected to the wiring 60. The back gate of the transistor MW5 may be electrically connected to a wiring different from the wiring 60.

The transistor MN4 is provided to fix the voltage of the node N4 when the DAC 52 is inactive. Like the transistor MP4, the transistor MN4 may be provided as needed. A source of the transistor MN4 is electrically connected to the VSS line, and a drain of the transistor MN4 is electrically connected to the node N4. The signal CMEB2 controls the on/off of the transistor MN4. The signal CMEB2 is an inverted signal of the signal CME2. The signal CMEB2 can also be generated inside the circuit 121. For example, an inverter circuit to which the signal CME2 is input may be provided in the circuit 121, and an output of the inverter circuit may be input to a gate of the transistor MN4.

When the signal CME2 is at the H-level, the DAC 52 is active and the transistor MN4 is off. In this state, IREF2 is input to the node N4. When the signal CME2 is at the L-level, the DAC 52 is inactive and the transistor MN4 is on. Thus, when the DAC 52 is inactive, the voltage of the node N4 is fixed to VSS.

<<Circuit 122>>

Figure 6B:
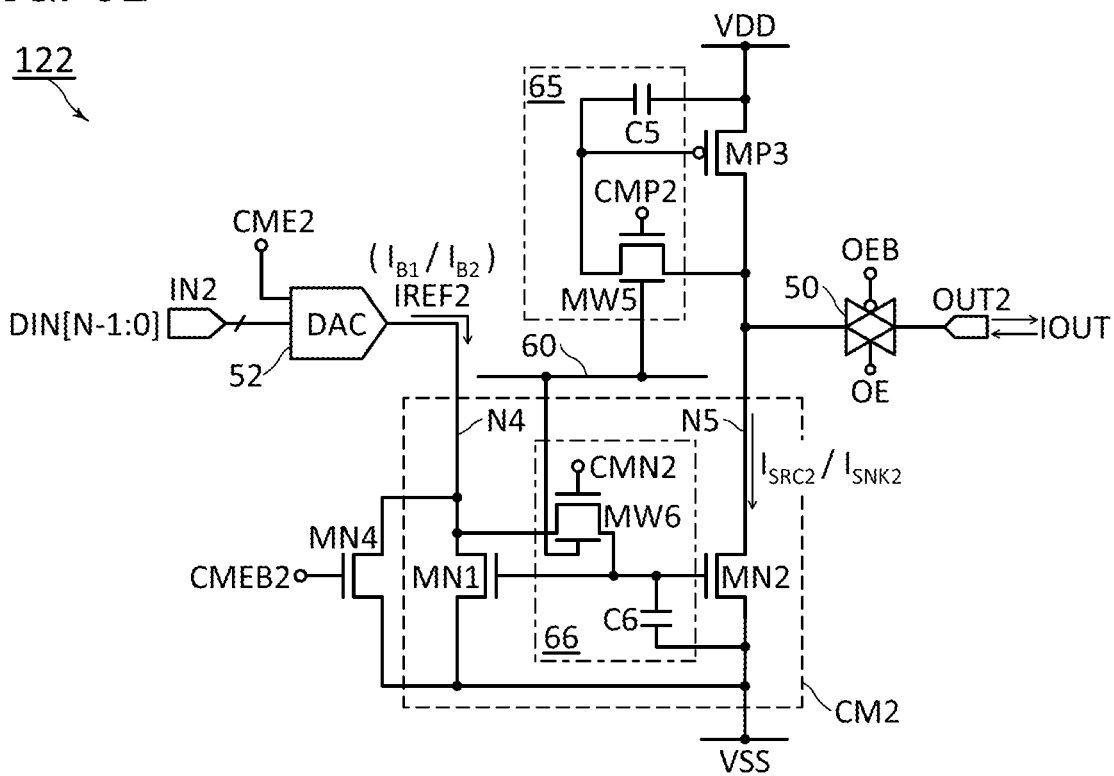

The circuit 122 in FIG. 6B is a modification example of the circuit 121. The circuit 122 is different from the circuit 121 in the circuit configuration of the memory circuit for storing the gate voltage of the transistor MN2. A memory circuit 66 in FIG. 6B corresponds to the memory circuit 64 in FIG. 6A. In other words, the circuit 122 has a circuit configuration in which transistors have conductivity types opposite to those of the transistors MP1, MP2, MP4, and MN3 in the circuit 112.

The memory circuit 66 includes a capacitor C6 and a transistor MW6. A first terminal of the capacitor C6 is electrically connected to the gate of the transistor MN2, and a second terminal of the capacitor C6 is electrically connected to the VSS line. The transistor MW6 is a path transistor which controls the electrical connection between the gate and a drain of the transistor MN1. The on/off of the transistor MW6 is controlled by the signal CMN2. The transistor MN1 is diode-connected when the transistor MW6 is on. The transistor MW6 has a configuration similar to that of the transistor MW4.

<<Example of Operation of Circuits 111 and 112>>

An example of the operation of the circuits 111 and 112 will be described with reference to FIG. 5. Note that the operation of the circuit 112 is similar to that of the circuit 111. Therefore, for an example of the operation of the circuit 112, refer to that of the circuit 111 described here. For convenience, IOUT corresponding to a source current has a positive value, and IOUT corresponding to a sink current has a negative value.

In FIG. 5, T1 and the like each denote a period. A change in the voltage of the VDD line is denoted by VDD. Here, power gating of the circuit 111 is performed. A power gating period is denoted by T6. To perform power gating, for example, a power switch which controls the voltage supply to the VDD line may be provided. In a period in which the signal OE is at the L-level (the TG 50 is off), the terminal OUT1 has a high impedance (Hi-Z).

(T1: Mode A1)

The operation mode of the circuit 111 in T1 is the mode A1, in which the value of $I_{SNK1}$ is stored in the circuit 111. Specifically, the gate voltage of the transistor MN3 at the time when $I_{SNK1}$ is flows through the node N2 is stored in the memory circuit 62.

First, the circuit 111 is configured to be able to output $I_{SNK1}$. The signals CMN1 and CMP1 are set at the H-level to turn on the transistors MW2 and MW1. Furthermore, the signal CME1 is set at the H-level to activate the DAC 51. A signal DA1 for setting the value of $I_{SNK1}$ is input to the terminal IN1. The DAC 51 outputs IREF1 having a value corresponding to that of the signal DA1. Here, IREF1 in T1 is denoted by $I_{A1}$. The circuit CM1 outputs $I_{SNK1}$ which is proportional to $I_{A1}$.

The signal DA1 is input to the DAC 51 for a predetermined period of time. Before the input of the signal DA1 is stopped, the signal CMN1 is set at the L-level to turn off the transistor MW2. Consequently, the gate voltage ($V_{GN3}$) of the transistor MN3 through which $I_{SNK1}$ flows is written to the memory circuit 62.

(T2: Mode A2)

After the mode A1, the mode A2 is executed, in which the value of $I_{SRC1}$ is stored in the circuit 111. Specifically, to obtain a configuration in which the circuit CM1 can output $I_{SRC1}$, the gate voltage ($V_{GA2}$) of the transistor MP2 at the time when the circuit CM1 outputs $I_{SRC1}$ is stored in the memory circuit 61.

A signal DA2 is input to the DAC 51. The DAC 51 outputs IREF1 having a value corresponding to that of the signal DA2. Here, IREF1 in T2 is denoted by $I_{A2}$. The circuit CM1 outputs $I_{SRC1}$ which is proportional to $I_{A2}$. The signal DA2 is input to the DAC 51 for a predetermined period of time. Before the input of the signal DA2 is stopped, the signal CMP1 is set at the L-level to turn off the transistor MW1. Consequently, the gate voltage of the transistor MP2 through which $I_{SRC1}$ flows is written to the memory circuit 61.

The input of the signal DA2 is stopped, and the signal CME1 is set at the L-level. The DAC 51 becomes inactive. The transistor MP4 is turned on, so that the voltage of the node N1 is fixed to VDD.

(T3: Standby Mode)

The operation mode of the circuit 111 in T3 is a standby mode, in which the circuit 111 is in the standby state. In the memory circuit 61, $V_{GA2}$ is held by the capacitor C1. In the memory circuit 62, $V_{GN3}$ is held by the capacitor C2. The operation modes in T5 and T7 are also the standby mode, in which the memory circuit 61 and the memory circuit 62 retain $V_{GA2}$ and $V_{GN3}$, respectively.

(T4: Mode A3 (Output Mode))

The operation mode of the circuit 111 in T4 is an output mode (the mode A3), in which IOUT is output. The signal OE is set at the H-level to turn on the TG 50. When $I_{SRC1}$ is higher than $I_{SNK1}$, the circuit 111 outputs a source current (+Ia) from the terminal OUT1. When $I_{SRC1}$ is lower than $I_{SNK1}$, the circuit 111 outputs a sink current (−Ia) from the terminal OUT1. The following equations are satisfied: $+Ia=+|I_{SRC1}-I_{SNK1}|$ and $-Ia=-|I_{SRC1}-I_{SNK1}|$.

Since the circuit 111 can output IOUT even when IREF1 is not input to the circuit CM1, the power consumption of the circuit 111 in operation can be suppressed.

(T5: Standby Mode)

By setting the signal OE at the L-level to turn off the TG 50, the circuit 111 returns to the standby state.

(T6: Power Gating)

Power gating is performed in T6. The power switch is turned off to stop the supply of VDD to the VDD line. The voltage of the VDD line decreases; therefore, neither $I_{SRC1}$ nor $I_{SNK1}$ flows in the circuit 111. The power gating can reduce the standby power of the circuit 111. The supply of a power supply voltage to the DAC 51 may also be stopped in T6. Thus, the standby power of the circuit 111 can be reduced more effectively.

(T7: Resumption of Power Supply and Standby Mode)

By turning on the power switch, the VDD line is charged to resume the voltage VDD. The circuit CM1 is supplied with VDD, so that the circuit 111 is brought into the standby state.

(T8: Mode A3 (Output Mode))

By setting the signal OE at the H-level to turn on the TG 50, the circuit 111 resumes the output of the source current (+Ia) or the sink current (−Ia) from the terminal OUT.

The transistors MW1 and MW2, each of which includes a wide-gap semiconductor, can suppress the leakage of charge from the capacitors C1 and C2. Accordingly, IOUT which maintains the value in T4 can be output from the terminal OUT1 again without rewriting data in the memory circuits 61 and 62. In other words, the modes A1 and A2 may be executed again only when IOUT needs to be changed.

<<Example of Operation of Circuits 121 and 122>>

An example of the operation of the circuits 121 and 122 will be described with reference to FIG. 7. The operation of the circuit 122 is similar to that of the circuit 121. Therefore, for an example of the operation of the circuit 122, refer to that of the circuit 121 described here.

(T1: Mode A1)

The operation mode of the circuit 121 in T1 is the mode A1, in which the value of $I_{SRC2}$ is stored in the circuit 121. Specifically, the gate voltage of the transistor MP3 at the time when the circuit CM2 outputs $I_{SRC2}$ is stored in the memory circuit 65.

The signals CMP2 and CMN2 are set at the H-level to turn on the transistors MW5 and MW4. The signal CME2 is set at the H-level to activate the DAC 52. A signal DB1 for setting the value of $I_{SRC2}$ is input to the terminal IN2. The DAC 52 outputs IREF2 having a value corresponding to that of the signal DB1. Here, IREF2 in T1 is denoted by $I_{B1}$. The circuit CM2 outputs $I_{SRC2}$ which is proportional to $I_{B1}$.

The signal DB1 is input to the DAC 52 for a predetermined period of time. Before the input of the signal DB1 is stopped, the signal CMP2 is set at the L-level to turn off the transistor MW5. Consequently, the gate voltage ($V_{GP3}$) of the transistor MP3 through which $I_{SRC2}$ flows is written to the memory circuit 65.

(T2: Mode A2)

After the mode A1, the mode A2 is executed, in which the value of $I_{SNK2}$ is stored in the circuit 121. Specifically, the gate voltage of the transistor MN2 at the time when the circuit CM2 outputs $I_{SNK2}$ is stored in the memory circuit 64.

A signal DB2 is input to the DAC 52. The DAC 52 outputs IREF2 having a value corresponding to that of the signal DB2. Here, IREF2 in T2 is denoted by $I_{B2}$. The circuit CM2 outputs $I_{SNK2}$ which is proportional to $I_{B2}$. The signal DB2 is input to the DAC 52 for a predetermined period of time. Before the input of the signal DB2 is stopped, the signal CMN2 is set at the L-level to turn off the transistor MW4. Consequently, the gate voltage ($V_{GN2}$) of the transistor MN2 through which $I_{SNK2}$ flows is written to the memory circuit 64.

The input of the signal DB2 is stopped, and the signal CME2 is set at the L-level. Accordingly, the DAC 52 becomes inactive. Furthermore, the transistor MN4 is turned on, so that the voltage of the node N4 is fixed to VSS.

(T3: Standby Mode)

In T3, the circuit 121 is in the standby state. In the memory circuit 64, $V_{GB2}$ is held by the capacitor C4. In the memory circuit 65, $V_{GP3}$ is held by the capacitor C5.

(T4: Mode A3 (Output Mode))

In T4, the circuit 121 outputs IOUT. The signal OE is set at the H-level to turn on the TG 50. When $I_{SRC2}$ is higher than $I_{SNK2}$, the circuit 121 outputs a source current (+Ib) from the terminal OUT2. When $I_{SRC2}$ is lower than $I_{SNK2}$, the circuit 121 outputs a sink current (−Ib) from the terminal OUT2. The following equations are satisfied: $+Ib=+|I_{SRC2}-I_{SNK2}|$ and $-Ib=-|I_{SRC2}-I_{SNK2}|$. Since the circuit 121 can output IOUT even when IREF2 is not input to the circuit CM2, the power consumption of the circuit 121 can be suppressed.

The operation of the circuit 121 in T5 to T8 is similar to the operation of the circuit 111 in T5 to T8; therefore, refer to its description.

Figure 8:
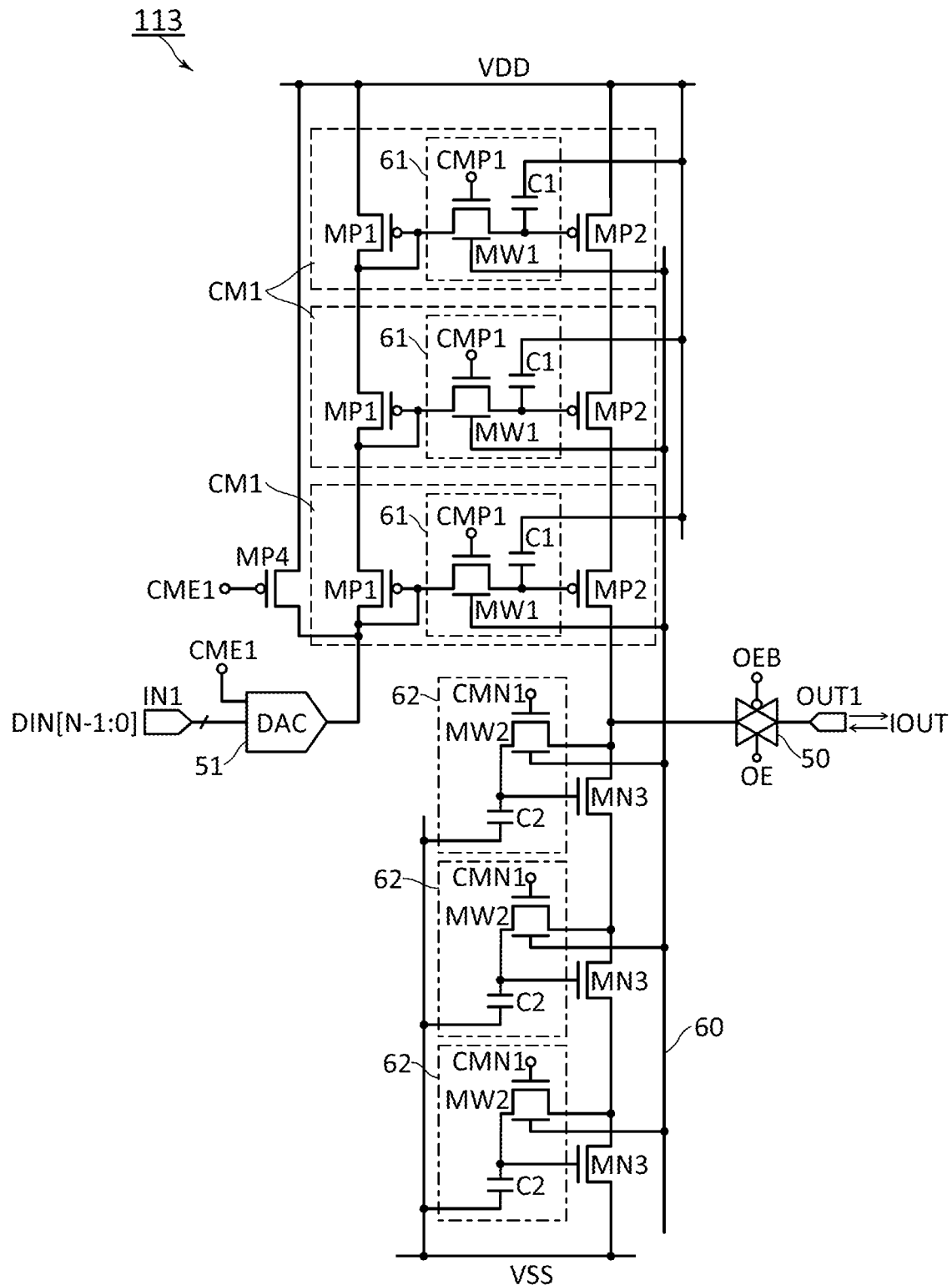
FIG. 8 is a circuit diagram illustrating a configuration example of a circuit.
Figure 9:
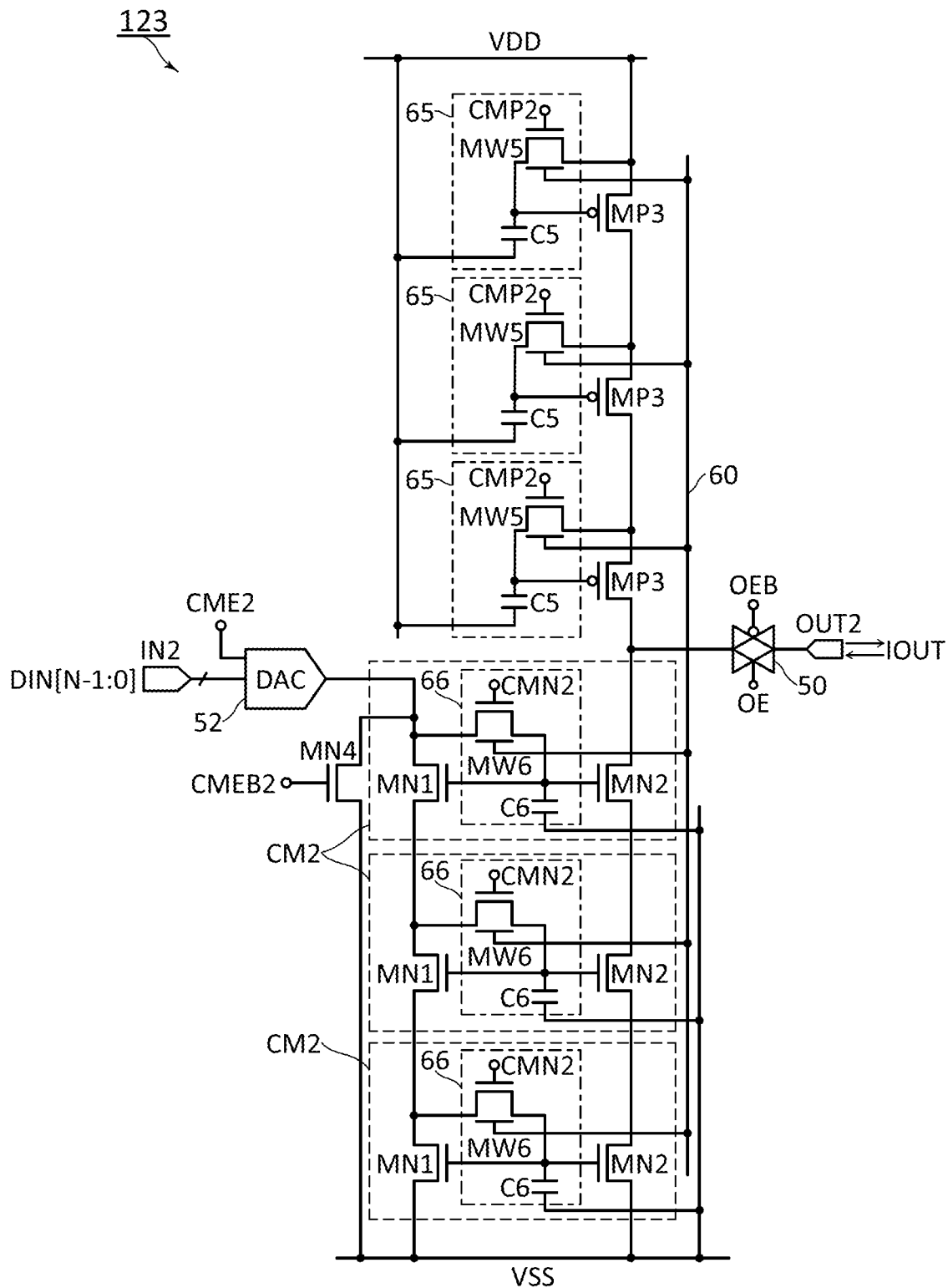
FIG. 9 is a circuit diagram illustrating a configuration example of a circuit.

In the case where the saturation characteristics of the transistors MP1, MP2, and MN3 in the circuits 111 and 112 are not favorable, a plurality of circuits CM1 which are cascode-connected and a plurality of transistors MN3 which are cascode-connected may be provided. FIG. 8 illustrates an example of such a circuit. In the case where the saturation characteristics of the transistors MN1, MN2, and MP3 in the circuits 121 and 122 are not favorable, a plurality of circuits CM2 which are cascode-connected and a plurality of transistors MP3 which are cascode-connected may be provided. FIG. 9 illustrates an example of such a circuit.

<<Circuit 113>>

A circuit 113 illustrated in FIG. 8 is a modification example of the circuit 111 and operates in a manner similar to that of the circuit 111. The circuit 113 includes three circuits CM1, three memory circuits 61, three transistors MN3, three memory circuits 62, the terminal IN1, the terminal OUT1, the TG 50, the DAC 51, and the transistor MP4. The three circuits CM1 are cascode-connected and are each provided with the memory circuit 61. The three transistors MN3 are cascode-connected and are each provided with the memory circuit 62.

<<Circuit 123>>

A circuit 123 illustrated in FIG. 9 is a modification example of the circuit 122 and operates in a manner similar to that of the circuit 122. The circuit 123 includes three circuits CM2, three memory circuits 66, three transistors MP3, three memory circuits 65, the terminal IN2, the terminal OUT2, the TG 50, the DAC 52, and the transistor MN4. The three circuits CM2 are cascode-connected and are each provided with the memory circuit 66. The three transistors MP3 are cascode-connected and are each provided with the memory circuit 65.

The above-described circuits such as the circuits 101 and 102 have both a function of a variable current source circuit and a function of a variable current sink circuit and can be referred to as, for example, a variable current source/sink circuit. Such a circuit can be used for a variety of analog circuits processing current signals. In this embodiment, a multiplier circuit will be described as an example.

<Multiplier Circuit>

Figure 10:
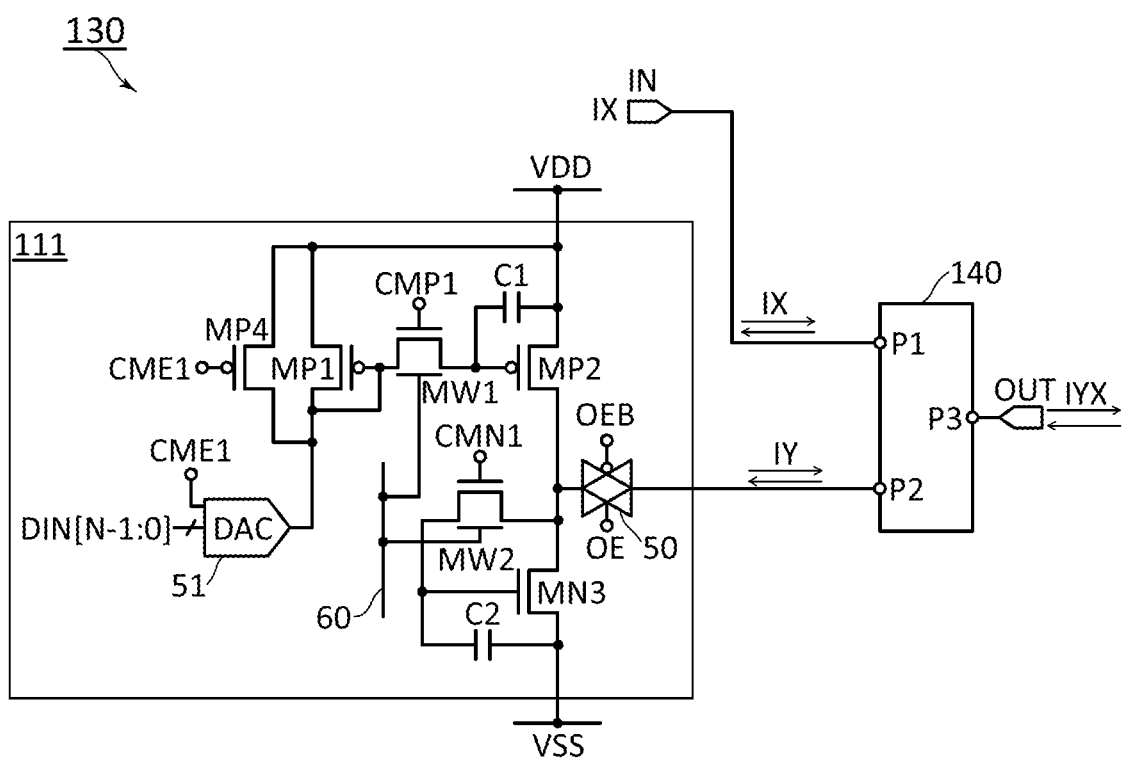
FIG. 10 is a circuit diagram illustrating a configuration example of a multiplier circuit.

FIG. 10 is a circuit diagram illustrating a configuration example of a multiplier circuit. A multiplier circuit 130 in FIG. 10 has a function of multiplying a current input from an input terminal by a constant. The multiplier circuit 130 includes an input terminal (terminal IN), an output terminal (terminal OUT), a multiplier circuit 140, and the circuit 111.

The circuit 111 is provided to generate a current corresponding to a constant that the multiplier circuit 140 uses for arithmetic operation. A current generated by the circuit 111, which is denoted by IY, is input to the multiplier circuit 140. Although the circuit 111 is used to generate IY here, any of the circuits 112, 113, and 121 to 123 may also be used.

The multiplier circuit 140 is a current-mode multiplier circuit (also referred to as a current multiplier circuit) and includes two input terminals (terminals P1 and P2) and one output terminal (a terminal P3). The terminal P1 is electrically connected to the terminal IN and is supplied with IX. The terminal P2 is electrically connected to the output terminal of the circuit 111 and is supplied with IY. The terminal P3 is electrically connected to the terminal OUT. The multiplier circuit 130 multiplies the current (IX) input to the terminal P1 by the current (IY) input to the terminal P2 to generate IYX=IY×IX, which is the output current of the multiplier circuit 140. IX may be a source current or a sink current. For example, IX corresponding to a source current may have a positive value, and IX corresponding to a sink current may have a negative value. The same applies to IY.

In the example in FIG. 10, the current-mode multiplier circuit is used for the arithmetic portion of the multiplier circuit 130; in the case where a voltage is input to the terminal IN, a multiplier circuit having a function of multiplying an input voltage by an input current may be used for the arithmetic portion.

Furthermore, by combining a multiplication operation portion that performs multiplication with an accumulation operation portion that accumulates the outputs of the multiplication operation portion, a product-sum operation circuit can be obtained. The multiplier circuit 130 may be used as the multiplication operation portion. In signal processing, multiplication and sum-product operation in which the results of the multiplication are accumulated are main arithmetic operations. Therefore, the multiplier circuit 130 can be used for signal processing circuits in various fields. A signal processing circuit including the multiplier circuit 130, a system including the multiplier circuit 130, and the like will be described below. For example, the multiplier circuit 130 is integrated into a semiconductor device for a video delivery system. In the following example, a television (TV) broadcast system will be described as a video delivery system.

<<Broadcast System>>

Figure 11:
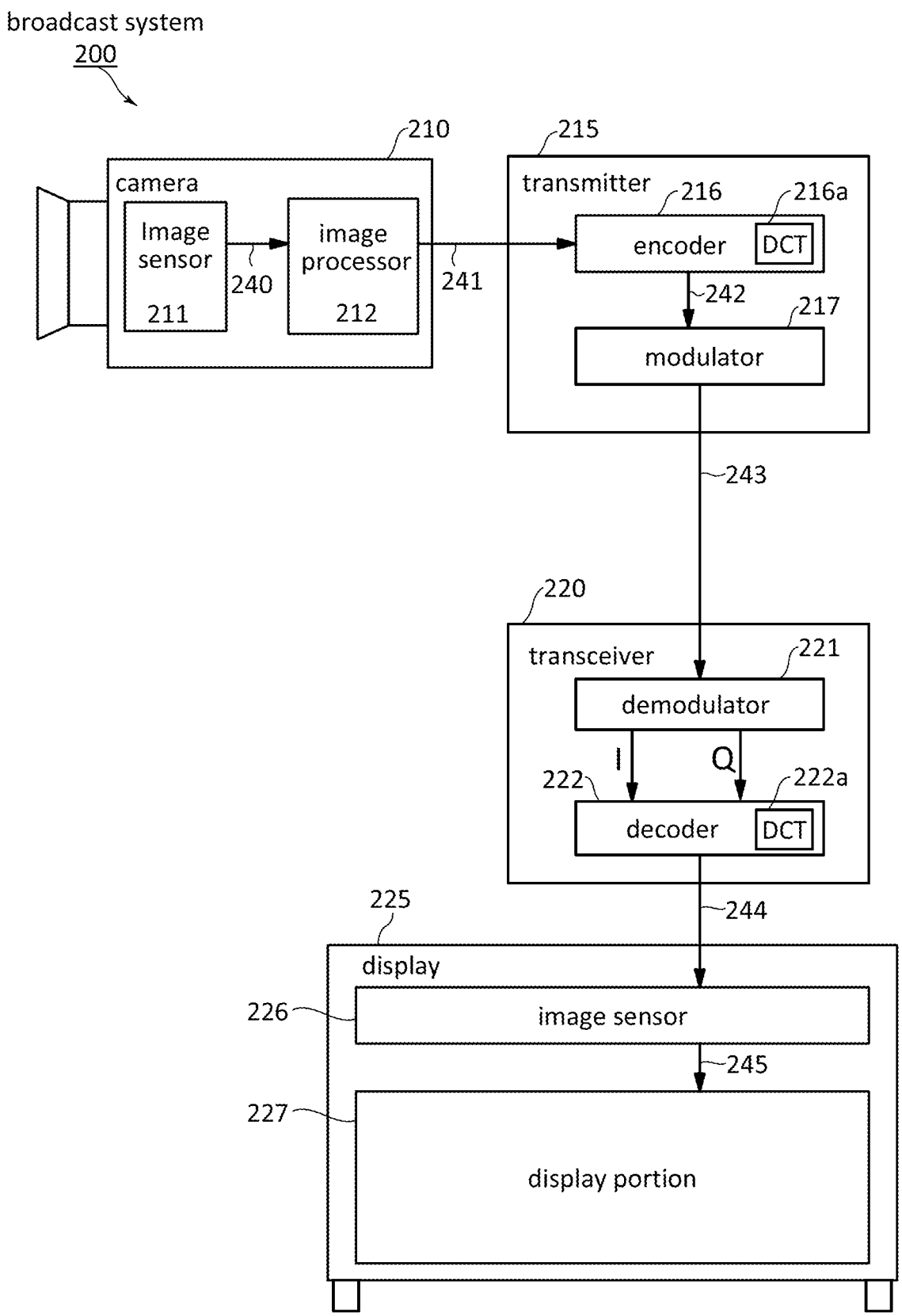
FIG. 11 is a block diagram illustrating a configuration example of a broadcast system.

FIG. 11 is a block diagram schematically illustrating a configuration example of a broadcast system. A broadcast system 200 includes a camera 210, a transmitter 215, a receiver 220, and a display device 225. The camera 210 includes an image sensor 211 and an image processor 212. The transmitter 215 includes an encoder 216 and a modulator 217. The receiver 220 includes a demodulator 221 and a decoder 222. The display device 225 includes an image processor 226 and a display portion 227.

When the camera 210 is capable of taking an 8K video, the image sensor 211 includes a sufficient number of pixels to capture an 8K color image. For example, when each pixel includes one red (R) subpixel, two green (G) subpixels, and one blue (B) subpixel, the image sensor 211 includes 7680×4320×4 [R, G+G, and B] pixels.

The image sensor 211 generates raw data 240 which has not been processed. The image processor 212 performs image processing (e.g., noise removal or interpolation) on the raw data 240 and generates video data 241. The video data 241 is output to the transmitter 215.

The transmitter 215 processes the video data 241 and generates a broadcast signal (carrier wave) 243 that accords with a broadcast band. To reduce the amount of data to be transmitted, the encoder 216 generates encoded data 242 by processing the video data. The encoder 216 performs processing such as encoding of the video data 241, addition of broadcast control data (e.g., authentication data) to the video data 241, encryption, or scrambling (data rearrangement for spread spectrum).

The modulator 217 performs IQ modulation (quadrature amplitude modulation) on the encoded data 242 to generate and output the broadcast signal 243. The broadcast signal 243 is a composite signal including data on an I (identical phase) component and a Q (quadrature phase) component. A TV broadcast station plays a role in obtaining the video data 241 and supplying the broadcast signal 243.

The receiver 220 receives the broadcast signal 243. The receiver 220 has a function of converting the broadcast signal 243 into video data 244 that can be displayed on the display device 225. The demodulator 221 demodulates the broadcast signal 243 and decomposes it into two analog signals: an I signal and a Q signal.

The decoder 222 has a function of converting the I signal and the Q signal into a digital signal. Moreover, the decoder 222 executes various processing on the digital signal and generates a data stream. This processing includes frame separation, decryption of a low density parity check (LDPC) code, separation of broadcast control data, descrambling, and the like. The decoder 222 decodes the data stream and generates the video data 244.

The video data 244 is input to the image processor 226 of the display device 225. The image processor 226 processes the video data 244 and generates a data signal 245 that can be input to the display portion 227. Examples of the processing by the image processor 226 include image processing (gamma processing) and digital-analog conversion. When receiving the data signal 245, the display portion 227 displays an image.

The encoder 216, the decoder 222, or the like can be combined with a dedicated IC or processor (e.g., GPU or CPU), for example. It is also possible to integrate the decoder 222 into one dedicated IC chip.

For example, the encoder 216 may be integrated into the camera 210.

Alternatively, a circuit having a function of part of the encoder 216 may be integrated into the camera 210 to give the function to the camera 210. For example, a DCT circuit 216a for encoding the video data 241 can be integrated into the camera 210.

In addition, one embodiment of the present invention is not limited to the example in FIG. 11, in which the receiver 220 and the display device 225 are separate electronic devices. For example, an electronic device including the receiver 220 and the display device 225 or an electronic device including the decoder 222 and the display device 225 can also be used for the broadcast system 200. Examples of such an electronic device are a television device, a smartphone, and a tablet terminal.

Specific examples of processing for data compression by the encoder 216 and processing for data decompression by the decoder 222 include intra-picture (intra-frame) prediction, inter-picture (inter-frame) prediction, orthogonal transform (discrete cosine transform (DCT) and discrete sine transform (DST)), and variable-length coding. Note that the discrete cosine transform and the inverse discrete cosine transform simply show an inverse relationship between data to be converted and converted data and can be achieved by equivalent operations. Therefore, the discrete cosine transform and the inverse discrete cosine transform are collectively referred to as discrete cosine transform in some cases. Similarly, the discrete sine transform and the inverse discrete sine transform are collectively referred to as discrete sine transform in some cases.

For example, the encoder 216 includes a circuit dedicated to the above signal processing, such as the DCT circuit 216a for performing DCT. Similarly, the decoder 222 includes a DCT circuit 222a. The multiplier circuit 130 can be used for the DCT circuit 216a. In a similar manner, the multiplier circuit 130 can be used for the DCT circuit 222a.

For example, a two-dimensional discrete cosine transform (2D-DCT) is calculated by Equation (f1). In Equation (f1), C, X, and Z are each a square matrix. In general, the number of elements in the rows and columns of the matrix C is a power of 2. The same applies to the matrices X and Z. The matrix X is a matrix whose elements are data to be processed. The matrix C is a DCT matrix whose elements are coefficients. The matrix Z is a DCT coefficient matrix whose elements are coefficients obtained by DCT. For example, in the case of 2D-DCT (4×4), Equation (f1) is expressed by Equation (f2). In Equation (f2), a, b, and c are each a positive real number. In the standard "MPEG-H HEVC", 2D-DCT is performed on blocks with different sizes (4×4, 8×8, 16×16, and 32×32).

[Formula 1]

$$Z = CXC^T \tag{f1}$$

$$Z = \begin{pmatrix} b & b & b & b \\ a & c & -c & -a \\ b & -b & -b & b \\ c & -a & a & -c \end{pmatrix} \begin{pmatrix} X11 & X12 & X13 & X14 \\ X21 & X22 & X23 & X24 \\ X31 & X32 & X33 & X34 \\ X41 & X42 & X43 & X44 \end{pmatrix} \begin{pmatrix} b & a & b & c \\ b & c & -b & -a \\ b & -c & -b & a \\ b & -a & b & -c \end{pmatrix} \tag{f2}$$

The multiplier circuit 130 can be used to calculate the product CX of the matrix C and the matrix X, for example. Specifically, the multiplier circuit 130 can calculate $C_{ij}X_{jk}$, where $C_{ij}$ and $X_{jk}$ denote an element of the matrix C and an element of the matrix X, respectively. The multiplier circuit 130 is suitable for the multiplication of a constant and a signal. Note that $C_{ij}$ is a constant and $X_{jk}$ is a variable. Therefore, the current IY corresponding to $C_{ij}$ may be generated by the circuit 111 in the multiplier circuit 130, and the current IX corresponding to $X_{jk}$ may be externally generated and then input to the multiplier circuit 130. As long as $C_{ij}$ keeps the same value, the memory circuits 61 and 62 of the circuit 111 require no rewriting operation. Thus, the use of the multiplier circuit 130 can increase the processing speed of the DCT circuits 216a and 222a and reduce the power consumption thereof.

(Embodiment 2)

In this embodiment, examples of a manufacturing method and a structure of an electronic component will be described. Furthermore, electronic devices and the like each including the electronic component will be described.

<<Example of Manufacturing Method of Electronic Component>>

Figure 12A:
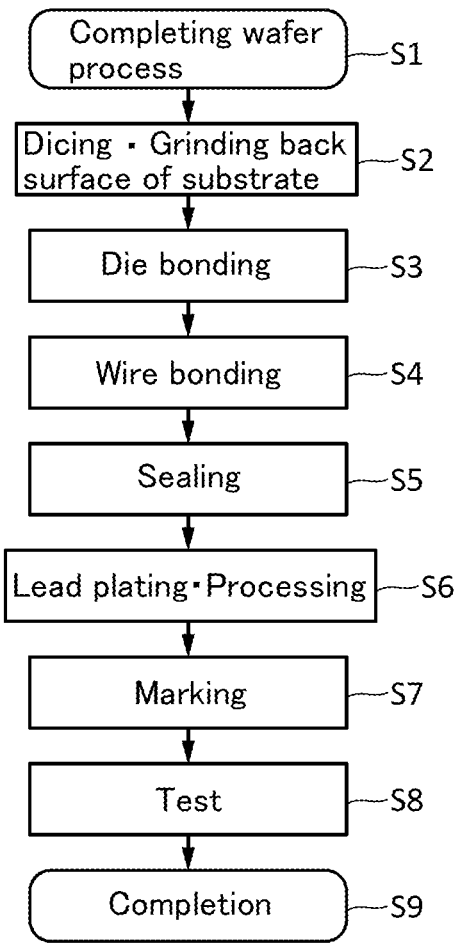
FIG. 12A is a flow chart illustrating an example of a method for manufacturing an electronic component.

FIG. 12A is a flow chart illustrating an example of a manufacturing method of an electronic component. An electronic component is completed in such a manner that a plurality of detachable components is integrated on a printed board through a process of forming devices such as transistors (pre-process) and an assembly process (post-process). FIG. 12A illustrates an example of the post-process. An electronic component completed through the post-process in FIG. 12A can be referred to as a semiconductor package, an IC package, or a package. The electronic component has various standards and names depending on the direction, the shape, and the like of terminals. Therefore, the following description is just an example.

First, an element substrate is completed through a pre-process (Step S1). Then, a dicing step of dividing the substrate into a plurality of chips is performed (Step S2). Before the substrate is divided into plural pieces, the substrate is thinned to reduce warpage or the like of the substrate caused in the pre-process and to reduce the size of the component. The chip is picked up, mounted on a lead frame, and bonded thereto in a die bonding step (Step S3). In the die bonding step, the chip may be bonded to the lead frame with a resin or a tape. As the bonding method, a method suitable for the product may be selected. In the die bonding step, the chip may be mounted on an interposer and bonded thereto. In a wire bonding step, a lead of the lead frame and an electrode on the chip are electrically connected to each other with a metal wire (Step S4). As the metal wire, a silver wire or a gold wire can be used. The wire bonding may be either ball bonding or wedge bonding.

The wire-bonded chip is subjected to a molding step of sealing the chip with an epoxy resin or the like (Step S5). The lead of the lead frame is plated. Then, the lead is cut and processed (Step S6). The plating process prevents rust of the lead and facilitates soldering at the time of mounting on a printed board in a later step. Printing (marking) is performed on the package surface (Step S7). After a testing step (Step S8), the electronic component is completed (Step S9).

<<Structure Example of Electronic Component>>

Figure 12B:
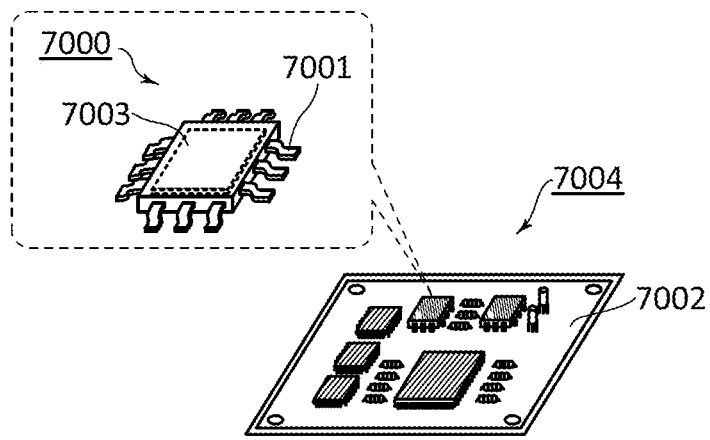
FIG. 12B is a schematic perspective view illustrating a structure example of an electronic component.

FIG. 12B is a schematic perspective view of an electronic component. As an example, FIG. 12B illustrates a quad flat package (QFP). In FIG. 12B, an electronic component 7000 includes a lead 7001 and a circuit portion 7003. In the circuit portion 7003, for example, the current generating circuit and the multiplier circuit of Embodiment 1 are formed. The electronic component 7000 is mounted on a printed board 7002, for example. A plurality of electronic components 7000 is combined and electrically connected to each other over the printed board 7002. The completed circuit board 7004 is mounted on an electronic device.

The electronic component 7000 can be used for various kinds of processors, for example. Specifically, the electronic component 7000 can be used as an electronic component (IC chip) of electronic devices in a wide variety of fields, such as digital signal processing, software-defined radio systems, avionic systems (electronic devices used for aircrafts, e.g., communication systems, navigation systems, autopilot systems, and flight management systems), ASIC prototyping, medical image processing, sound recognition, encryption, bioinformatics, emulators for mechanical systems, radio telescopes in radio astronomy, and in-car electronic devices.

Other examples of an electronic device that can be equipped with the electronic component 7000 include smartphones, mobile phones, game machines including portable game consoles, e-book readers, cameras (e.g., video cameras and digital still cameras), wearable information terminals (e.g., head-mounted, goggle-type, glasses-type, armband-type, bracelet-type, wristwatch-type, and necklace-type devices), navigation systems, audio reproducing devices (e.g., car audio systems and digital audio players), tuners for receiving TV broadcasting, copiers, facsimiles, printers, multifunction printers, automated teller machines (ATM), and vending machines. FIGS. 13A to 13H illustrate specific examples of such an electronic device.

Figure 13A:
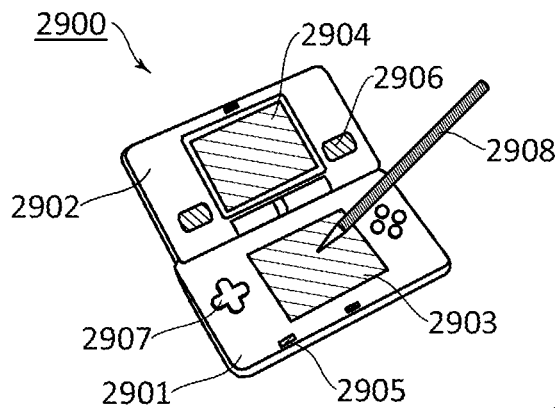
FIGS. 13A to 13H each illustrate a structure example of an electronic device.

A portable game console 2900 illustrated in FIG. 13A includes a housing 2901, a housing 2902, a display portion 2903, a display portion 2904, a microphone 2905, a speaker 2906, an operation key 2907, and the like. The display portion 2903 is provided with a touch screen as an input device, which can be handled with a stylus 2908 or the like.

Figure 13B:
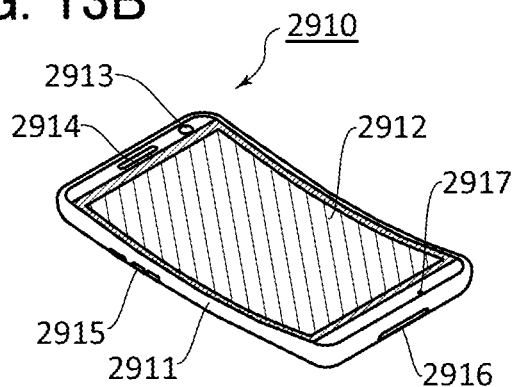

An information terminal 2910 illustrated in FIG. 13B includes a housing 2911, a display portion 2912, a microphone 2917, a speaker portion 2914, a camera 2913, an external connection portion 2916, an operation button 2915, and the like. The display portion 2912 includes a display panel and a touch screen which are formed using a flexible substrate. The information terminal 2910 can be used as, for example, a smartphone, a mobile phone, a tablet information terminal, a tablet PC, or an e-book reader.

Figure 13C:
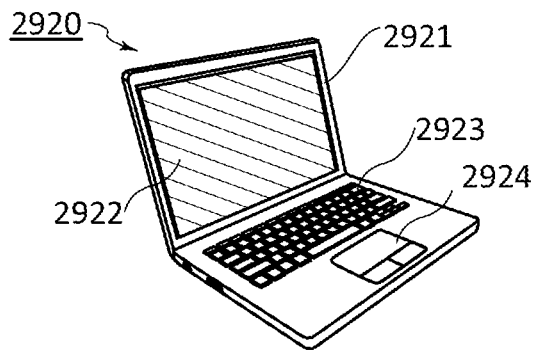

A laptop PC 2920 illustrated in FIG. 13C includes a housing 2921, a display portion 2922, a keyboard 2923, a pointing device 2924, and the like.

Figure 13D:
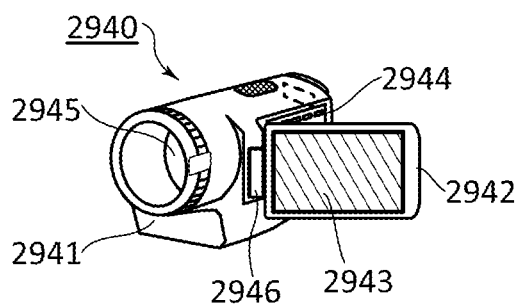

A video camera 2940 illustrated in FIG. 13D includes a housing 2941, a housing 2942, a display portion 2943, an operation key 2944, a lens 2945, a joint 2946, and the like. The operation key 2944 and the lens 2945 are provided in the housing 2941, and the display portion 2943 is provided in the housing 2942. The housing 2941 and the housing 2942 are connected to each other with the joint 2946, and the angle between the housing 2941 and the housing 2942 can be changed with the joint 2946. The orientation of an image on the display portion 2943 can be changed and display and non-display of an image can be switched depending on the angle between the housing 2941 and the housing 2942.

Figure 13E:
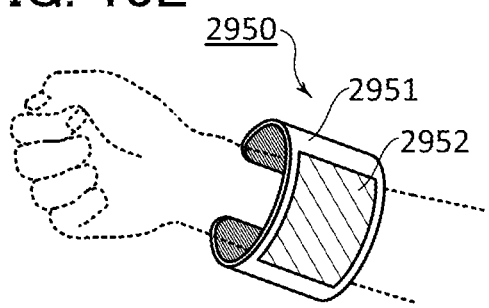

FIG. 13E illustrates an example of a bangle-type information terminal. An information terminal 2950 includes a housing 2951, a display portion 2952, and the like. The display portion 2952 is supported by the housing 2951 having a curved surface. A display panel formed using a flexible substrate is provided in the display portion 2952, whereby the information terminal 2950 can be a user-friendly information terminal that is flexible and lightweight.

Figure 13F:
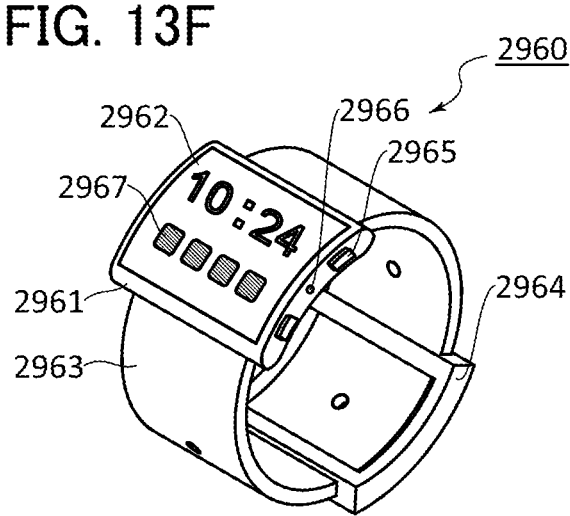

FIG. 13F illustrates an example of a wristwatch-type information terminal. An information terminal 2960 includes a housing 2961, a display portion 2962, a band 2963, a buckle 2964, an operation button 2965, an input/output terminal 2966, and the like. The information terminal 2960 is capable of executing a variety of applications such as mobile phone calls, e-mails, viewing and editing texts, music reproduction, Internet communication, and computer games.

The display surface of the display portion 2962 is curved, and images can be displayed on the curved display surface. Furthermore, the display portion 2962 includes a touch sensor, and operation can be performed by touching the screen with a finger, a stylus, or the like. For example, by touching an icon 2967 displayed on the display portion 2962, an application can be started. With the operation button 2965, a variety of functions such as time setting, power ON/OFF, ON/OFF of wireless communication, setting and cancellation of silent mode, and setting and cancellation of power saving mode can be performed. For example, the functions of the operation button 2965 can be set by the operating system incorporated in the information terminal 2960.

The information terminal 2960 can employ near field communication conformable to a communication standard. For example, mutual communication between the information terminal 2960 and a headset capable of wireless communication enables hands-free calling. Moreover, through a connector connected to the input/output terminal 2966, the information terminal 2960 can communicate data directly with another information terminal. Power charging through the input/output terminal 2966 is also possible. Note that the charging operation may be performed by wireless power feeding without using the input/output terminal 2966.

Figure 13G:
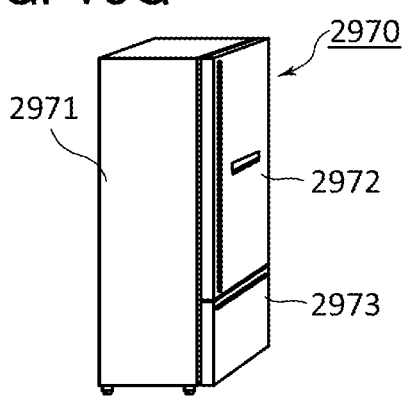

FIG. 13G illustrates an electric refrigerator-freezer as an example of a home electric appliance. An electric refrigerator-freezer 2970 includes a housing 2971, a refrigerator door 2972, a freezer door 2973, and the like.

Figure 13H:
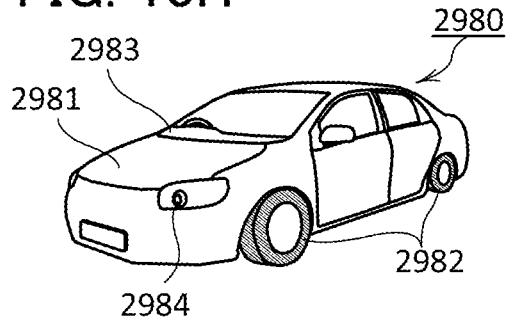

FIG. 13H is an external view illustrating a structure example of a car. A car 2980 includes a car body 2981, wheels 2982, a dashboard 2983, lights 2984, and the like. The electronic component of this embodiment can be incorporated not only in the car 2980 but also in ships, planes, and two-wheeled motor vehicles.

(Embodiment 3)

In this embodiment, a device structure and the like of an OS transistor will be described.

<<Structure Example 1 of Transistor>>

Figure 14A:
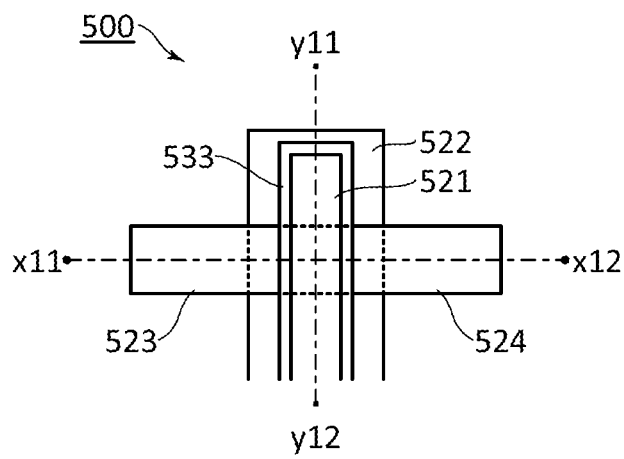
FIG. 14A is a top view illustrating a structure example of a transistor.
Figure 14B:
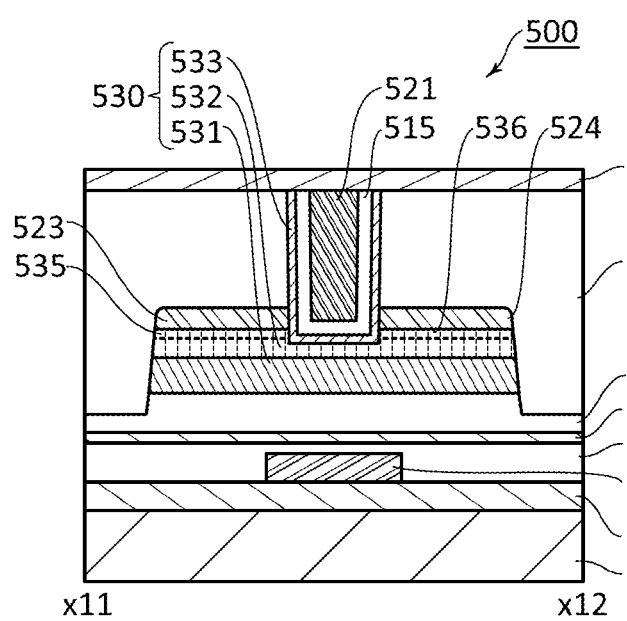
FIG. 14B is a cross-sectional view taken along line x11-x12 in FIG. 14A.
Figure 14C:
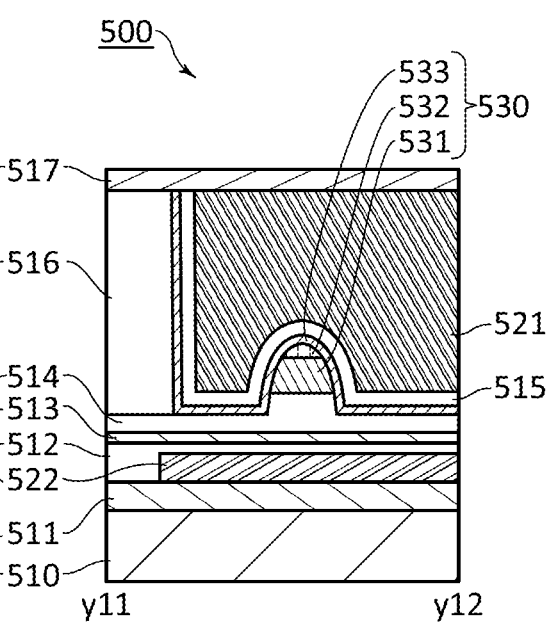
FIG. 14C is a cross-sectional view taken along line y11-y12 in FIG. 14A.

FIG. 14A is a top view of a transistor 500. FIG. 14B is a cross-sectional view taken along line x11-x12 in FIG. 14A, and FIG. 14C is a cross-sectional view taken along line y11-y12 in FIG. 14A. Note that the direction of line x11-x12 and the direction of line y11-y12 may be referred to as a channel length direction and a channel width direction, respectively, of the transistor 500. For simplification of the drawing, some components are not illustrated in FIG. 14A. The same applies to a top view such as FIG. 16A.

The transistor 500 is formed over a substrate 510. The transistor 500 includes insulating layers 511 to 517, conductive layers 521 to 524, and metal oxide layers 531 to 533. Each of these layers may have a single-layer structure or a stacked-layer structure. Here, the metal oxide layers 531 to 533 may be collectively referred to as a metal oxide layer 530.

The conductive layer 521 and the conductive layer 522 serve as a gate electrode (front gate electrode) and a back gate electrode, respectively, of the transistor 500. A region of the conductive layer 521 serving as a gate electrode is formed in a self-aligned manner so as to fill an opening formed in the insulating layer 516. The conductive layers 523 and 524 serve as a source electrode and a drain electrode. For example, in the case where the conductive layer 523 has a stacked-layer structure, it is preferable that a layer in contact with the metal oxide layer 532 be less likely to transmit oxygen than the other layers in the conductive layer 523. This can prevent a decrease in the conductivity of the conductive layer 523 due to oxidation. The above description also applies to the conductive layer 524.

The metal oxide layer 532 is formed using a semiconductor and includes a channel formation region. The metal oxide layer 531 and the metal oxide layer 532 form a metal oxide stack. In the stack, a region 535 in contact with the conductive layer 523 and a region 536 in contact with the conductive layer 524 have a lower resistivity than other regions. The region 535 contributes to a reduction in the contact resistance between the stack and the conductive layer 523. Similarly, the region 536 contributes to a reduction in the contact resistance between the stack and the conductive layer 524.

The insulating layers 511 to 517 each serve as a passivation layer or an interlayer insulating layer. Specifically, the insulating layer 511 serves as a base insulating layer of the transistor 500, the insulating layer 515 serves as a gate insulating layer, and the insulating layer 513 serves as a charge accumulation layer.

As illustrated in FIG. 14C, a side surface of the metal oxide layer 532 is surrounded by the conductive layer 521. In such a device structure, the metal oxide layer 532 can be electrically surrounded by an electric field of the conductive layer 521 (gate electrode). A structure in which a semiconductor (particularly, a channel formation region) is electrically surrounded by an electric field of a gate electrode is referred to as a surrounded channel (s-channel) structure. A channel of the s-channel transistor is formed in the whole (bulk) of the metal oxide layer 532. Therefore, a high current can flow between a source and a drain of the s-channel transistor, which leads to favorable on-state current characteristics. Moreover, the s-channel structure is suitable for a miniaturized transistor. Thus, the s-channel transistor can have a high on-state current and is suitable for a semiconductor device that requires a miniaturized transistor, such as a processor or a memory device.

Figure 15A:
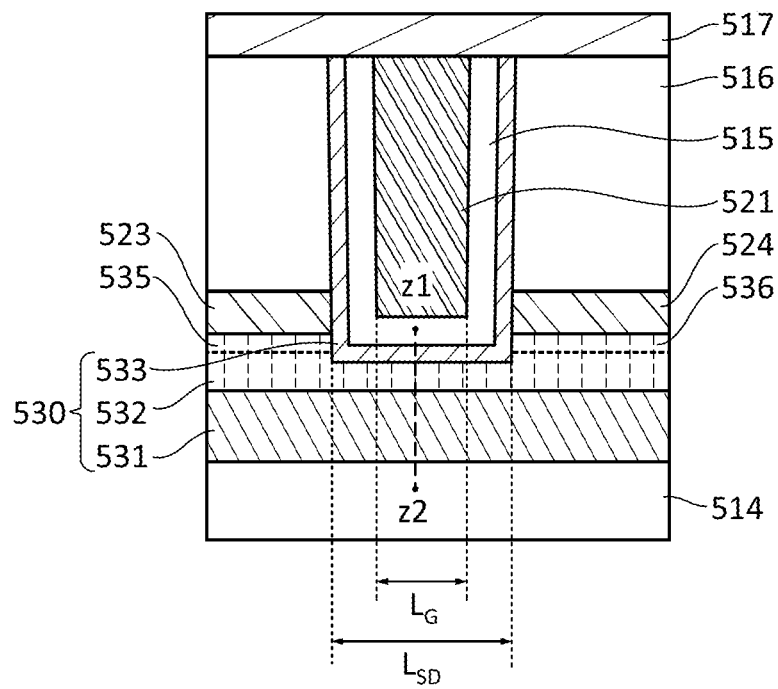
FIG. 15A is an enlarged view of part of FIG. 14B.

FIG. 15A is an enlarged view of the channel formation region of the transistor 500. In FIG. 15A, a width $L_G$ represents the length in the channel length direction of a region in which the bottom surface of the conductive layer 521 overlaps with the top surface of the metal oxide layer 532 with the insulating layer 515 and the metal oxide layer 533 positioned therebetween. The width $L_G$ corresponds to the line width of the gate electrode of the transistor 500. In FIG. 15A, a width $L_{SD}$ represents the length between the conductive layer 523 and the conductive layer 524. The width $L_{SD}$ corresponds to the length between the source electrode and the drain electrode of the transistor 500.

In general, the width $L_{SD}$ is determined by the minimum feature size. As illustrated in FIG. 15A, the width $L_G$ is smaller than the width $L_{SD}$. This means that the line width of the gate electrode of the transistor 500 can be made smaller than the minimum feature size. For example, the width $L_G$ can be greater than or equal to 5 nm and less than or equal to 60 nm, preferably greater than or equal to 5 nm and less than or equal to 30 nm.

<Metal Oxide>

The metal oxide layer 532 is an oxide semiconductor containing indium (In), for example. The metal oxide layer 532 containing indium has a high carrier mobility (electron mobility), for example. The metal oxide layer 532 preferably contains an element M The element M is preferably aluminum (Al), gallium (Ga), yttrium (Y), tin (Sn), or the like.

Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), and the like. Note that two or more of the above elements may be used in combination as the element M The element M is an element having a high bonding energy with oxygen, for example, an element whose bonding energy with oxygen is higher than that of indium. The element M is an element having a function of increasing the energy gap of the metal oxide, for example. Furthermore, the metal oxide layer 532 preferably contains zinc (Zn). A metal oxide containing zinc is easily crystallized in some cases.

The metal oxide layer 532 is not limited to the oxide semiconductor containing indium. For example, the metal oxide layer 532 may be formed using an oxide semiconductor that does not contain indium and contains at least one of zinc, gallium, and tin. Specifically, the metal oxide layer 532 can be formed using zinc tin oxide, gallium tin oxide, or the like.

For the metal oxide layer 532, for example, an oxide semiconductor with a large energy gap is used. For example, the energy gap of the metal oxide layer 532 is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV. A CAAC-OS described later is preferably used for the metal oxide layer 532.

For example, the metal oxide layers 531 and 533 preferably contain at least one of the metal elements contained in the metal oxide layer 532, in which case an interface state is less likely to be generated at the interface between the metal oxide layer 531 and the metal oxide layer 532 and the interface between the metal oxide layer 532 and the metal oxide layer 533.

In the case where an In-M-Zn oxide is used for the metal oxide layer 531, the proportions of In and M, the sum of which is assumed to be 100 atomic %, are preferably lower than 50 atomic % and higher than 50 atomic %, respectively, further preferably lower than 25 atomic % and higher than 75 atomic %, respectively. When the metal oxide layer 531 is deposited by a sputtering method, a sputtering target with the above composition is preferably used. For example, In:M:Zn is preferably 1:3:2 or 1:3:4.

In the case where an In-M-Zn oxide is used for the metal oxide layer 532, the proportions of In and M, the sum of which is assumed to be 100 atomic %, are preferably higher than 25 atomic % and lower than 75 atomic %, respectively, further preferably higher than 34 atomic % and lower than 66 atomic %, respectively. When the metal oxide layer 532 is deposited by a sputtering method, a sputtering target with the above composition is preferably used. For example, In:M:Zn is preferably 1:1:1, 1:1:1.2, 2:1:3, 3:1:2, or 4:2:4.1. In particular, when a sputtering target with an atomic ratio of In to Ga and Zn of 4:2:4.1 is used, the atomic ratio of In to Ga and Zn in the deposited metal oxide layer 532 may be 4:2:3 or in the neighborhood of 4:2:3.

In the case where an In-M-Zn oxide is used for the metal oxide layer 533, the proportions of In and M, the sum of which is assumed to be 100 atomic %, are preferably lower than 50 atomic % and higher than 50 atomic %, respectively, further preferably lower than 25 atomic % and higher than 75 atomic %, respectively. For example, In:M:Zn is preferably 1:3:2 or 1:3:4. The metal oxide layer 533 may be formed using the same kind of metal oxide as the metal oxide layer 531.

The metal oxide layer 531 or the metal oxide layer 533 does not necessarily contain indium in some cases. For example, the metal oxide layer 531 or the metal oxide layer 533 may contain gallium oxide.

(Energy Band Structure)

Figure 15B:
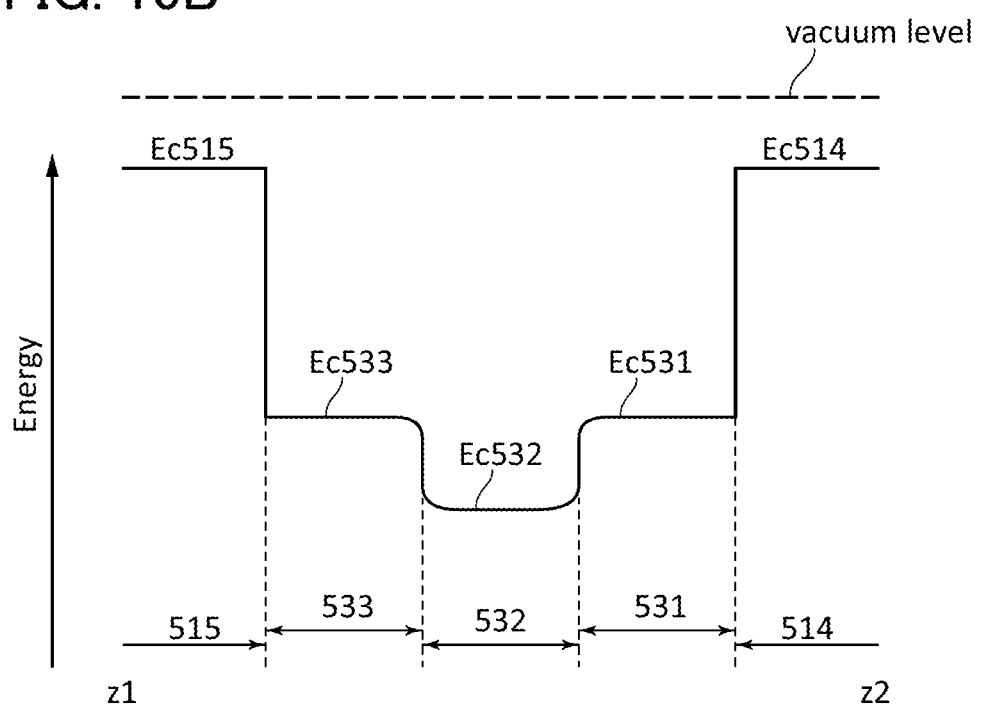
FIG. 15B is an energy band diagram of a transistor.

A function and an effect of the metal oxide layer 530 including the stacked metal oxide layers 531 to 533 will be described using the energy band diagram in FIG. 15B. FIG. 15B illustrates the energy band structure of a portion along line z1-z2 in FIG. 15A. Ec514, Ec531, Ec532, Ec533, and Ec515 represent the energy of the conduction band minimum of the insulating layer 514, that of the metal oxide layer 531, that of the metal oxide layer 532, that of the metal oxide layer 533, and that of the insulating layer 515, respectively.

Here, the energy difference between the vacuum level and the conduction band minimum (the energy difference is also referred to as an electron affinity) corresponds to a value obtained by subtracting an energy gap from the energy difference between the vacuum level and the valence band maximum (the energy difference is also referred to as an ionization potential). Note that the energy gap can be measured using a spectroscopic ellipsometer. The energy difference between the vacuum level and the valence band maximum can be measured using an ultraviolet photoelectron spectroscopy (UPS) device.

Since the insulating layers 514 and 515 are insulators, Ec514 and Ec515 are closer to the vacuum level than Ec531 to Ec533 (the insulating layers 514 and 515 each have a lower electron affinity than the metal oxide layers 531 to 533).

The metal oxide layer 532 is preferably formed using a metal oxide having a higher electron affinity than that used for the metal oxide layer 531 and the metal oxide layer 533. For example, the electron affinity of the metal oxide layer 532 is preferably higher than that of the metal oxide layer 531 by 0.07 eV or more and 1.3 eV or less. The difference between the electron affinity of the metal oxide layer 532 and that of the metal oxide layer 531 is preferably 0.1 eV or more and 0.7 eV or less, further preferably 0.15 eV or more and 0.4 eV or less. The same applies to the difference between the electron affinity of the metal oxide layer 532 and that of the metal oxide layer 533.

Indium gallium oxide has a low electron affinity and a high oxygen-blocking property. Therefore, the metal oxide layer 533 preferably contains indium gallium oxide. The fraction of gallium atoms [Ga/(In+Ga)] is, for example, 70% or higher, preferably 80% or higher, further preferably 90% or higher.

When a gate voltage is applied to the transistor 500, a channel is formed in the metal oxide layer 532 having a higher electron affinity in the metal oxide layer 530. At this time, electrons move mainly in the metal oxide layer 532, not in the metal oxide layers 531 and 533. Hence, even the presence of a large number of interface states, which inhibit the electron movement, at the interface between the metal oxide layer 531 and the insulating layer 514 or the interface between the metal oxide layer 533 and the insulating layer 515 hardly influences the on-state current of the transistor 500. In the transistor 500, the metal oxide layers 531 and 533 function like insulators.

In some cases, a mixed region of the metal oxide layer 531 and the metal oxide layer 532 exists therebetween. In some cases, a mixed region of the metal oxide layer 532 and the metal oxide layer 533 exists therebetween. The mixed region has a low interface state density. For this reason, the stack including the metal oxide layers 531 to 533 has a band structure in which the energy at each interface and in the vicinity of the interface changes continuously (continuous junction).

As described above, the interface between the metal oxide layer 531 and the metal oxide layer 532 or the interface between the metal oxide layer 532 and the metal oxide layer 533 has a low interface state density. Hence, the electron movement in the metal oxide layer 532 is less likely to be inhibited, which leads to an increase in the on-state current of the transistor 500.

The electron movement in the transistor 500 is inhibited, for example, in the case where physical unevenness of the channel formation region is large. To increase the on-state current of the transistor 500, for example, root mean square (RMS) roughness of the top surface or the bottom surface of the metal oxide layer 532 (a formation surface; here, the top surface of the metal oxide layer 531) in a measurement area of 1 μm×1 μm may be less than 1 nm, preferably less than 0.6 nm, further preferably less than 0.5 nm, still further preferably less than 0.4 nm. The average surface roughness (also referred to as Ra) in a measurement area of 1 μm×1 μm may be less than 1 nm, preferably less than 0.6 nm, further preferably less than 0.5 nm, still further preferably less than 0.4 nm. The maximum difference (also referred to as P-V) in a measurement area of 1 μm×1 μm may be less than 10 nm, preferably less than 9 nm, further preferably less than 8 nm, still further preferably less than 7 nm.

The electron movement is also inhibited in the case where the density of defect states is high in a region in which a channel is formed. For example, in the case where the metal oxide layer 532 includes oxygen vacancies (also denoted by $V_O$), donor states are formed by entry of hydrogen into sites of oxygen vacancies in some cases. In the following description, the state in which hydrogen occupies the site of an oxygen vacancy may be denoted by $V_OH$. $V_OH$ is a factor of decreasing the on-state current of the transistor because $V_OH$ causes electron scattering. Note that the site of an oxygen vacancy occupied by oxygen is more stable than that occupied by hydrogen. Therefore, by reducing oxygen vacancies in the metal oxide layer 532, the on-state current of the transistor can be increased in some cases.

For example, at a certain depth in the metal oxide layer 532 or in a certain region of the metal oxide layer 532, the hydrogen concentration measured by secondary ion mass spectrometry (SIMS) is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, still further preferably higher than or equal to $1\times10^{16}$ atoms/cm$^3$ and lower than or equal to $5\times10^{18}$ atoms/cm$^3$.

As a method for reducing oxygen vacancies in the metal oxide layer 532, for example, excess oxygen contained in the insulating layer 514 is moved to the metal oxide layer 532 through the metal oxide layer 531. In this case, the metal oxide layer 531 is preferably a layer having oxygen permeability (a layer through which oxygen can pass or permeate).

The metal oxide layer 532 can have a thickness greater than or equal to 1 nm and less than or equal to 20 nm. The thickness of the metal oxide layer 532 depends on the channel length and can be reduced together with the channel length, for example, to 1 nm or more and 15 nm or less, or 1 nm or more and 10 nm or less.

The metal oxide layer 531 can have a thickness greater than or equal to 5 nm and less than or equal to 200 nm, greater than or equal to 10 nm and less than or equal to 120 nm, greater than or equal to 20 nm less than or equal to 120 nm, or greater than or equal to 40 nm and less than or equal to 80 nm. The metal oxide layer 531 is preferably thicker than the metal oxide layer 532. An increase in the thickness of the metal oxide layer 531 can increase the distance from the interface between the adjacent insulator and the metal oxide layer 531 to the channel formation region.

The metal oxide layer 533 can have a thickness greater than or equal to 1 nm and less than or equal to 100 nm, greater than or equal to 1 nm and less than or equal to 50 nm, or greater than or equal to 1 nm and less than or equal to 10 nm. The metal oxide layer 533 is preferably thinner than the metal oxide layer 531 so that the on-state current of the transistor 500 can be increased.

For example, a region in which the silicon concentration measured by SIMS is higher than or equal to $1\times10^{16}$ atoms/cm$^3$ and lower than $1\times10^{19}$ atoms/cm$^3$ is provided between the metal oxide layer 532 and the metal oxide layer 531. The silicon concentration is preferably higher than or equal to $1\times10^{16}$ atoms/cm$^3$ and lower than $5\times10^{18}$ atoms/cm$^3$, further preferably higher than or equal to $1\times10^{16}$ atoms/cm$^3$ and lower than $2\times10^{18}$ atoms/cm$^3$. A region in which the silicon concentration measured by SIMS is higher than or equal to $1\times10^{16}$ atoms/cm$^3$ and lower than $1\times10^{19}$ atoms/cm$^3$ is provided between the metal oxide layer 532 and the metal oxide layer 533. The silicon concentration is preferably higher than or equal to $1\times10^{16}$ atoms/cm$^3$ and lower than $5\times10^{18}$ atoms/cm$^3$, further preferably higher than or equal to $1\times10^{16}$ atoms/cm$^3$ and lower than $2\times10^{18}$ atoms/cm$^3$.

It is preferable to reduce the hydrogen concentration in the metal oxide layer 531 and the metal oxide layer 533 in order to reduce the hydrogen concentration in the metal oxide layer 532. The metal oxide layer 531 and the metal oxide layer 533 each include a region in which the hydrogen concentration measured by SIMS is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, still further preferably higher than or equal to $1\times10^{16}$ atoms/cm$^3$ and lower than or equal to $5\times10^{18}$ atoms/cm$^3$. It is also preferable to reduce the nitrogen concentration in the metal oxide layer 531 and the metal oxide layer 533 in order to reduce the nitrogen concentration in the metal oxide layer 532. The metal oxide layer 531 and the metal oxide layer 533 each include a region in which the nitrogen concentration is higher than or equal to $1\times10^{16}$ atoms/cm$^3$ and lower than $5\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $1\times10^{18}$ atoms/cm$^3$, still further preferably higher than or equal to $1\times10^{16}$ atoms/cm$^3$ and lower than or equal to $5\times10^{17}$ atoms/cm$^3$. Note that the nitrogen concentration is measured by SIMS.

The metal oxide layers 531 to 533 may be deposited by a sputtering method, a chemical vapor deposition (CVD) method, a molecular beam epitaxy (MBE) method, a pulsed laser deposition (PLD) method, an atomic layer deposition (ALD) method, or the like.

After the metal oxide layers 531 and 532 are formed, first heat treatment is preferably performed. The first heat treatment may be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in the following manner: heat treatment is performed in an inert gas atmosphere, and then, another heat treatment is performed in an atmosphere containing an oxidizing gas at 10 ppm or more, 1% or more, or 10% or more in order to compensate desorbed oxygen. The first heat treatment can increase the crystallinity of the metal oxide layers 531 and 532 and remove impurities such as hydrogen and water.

One embodiment of the present invention is not limited to the example in FIGS. 14A to 14C, in which the metal oxide layer 530 has a three-layer structure. For example, the metal oxide layer 530 can have a two-layer structure without the metal oxide layer 531 or the metal oxide layer 533. Alternatively, it is also possible to employ an m-layer structure (m is an integer greater than 3) in which a single layer or a stack including any of the metal oxides shown as examples of the materials of the metal oxide layers 531 to 533 is provided in at least one of the positions over, under, and in the metal oxide layer 530.

<Substrate>

As the substrate 510, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate can be used, for example. Examples of the semiconductor substrate include a semiconductor substrate of silicon or germanium and a compound semiconductor substrate of silicon carbide, silicon germanium, gallium arsenide, indium phosphide, zinc oxide, or gallium oxide. The semiconductor substrate may have a bulk structure or a silicon on insulator (SOI) structure. Examples of the conductor substrate include a graphite substrate, a metal substrate, an alloy substrate (e.g., a stainless steel substrate), a conductive resin substrate, a substrate including a metal nitride, and a substrate including a metal oxide.

A flexible substrate may be used as the substrate 510. An example of the flexible substrate is a substrate made of a metal, an alloy, a resin, glass, or a fiber thereof. The flexible substrate preferably has a lower coefficient of linear expansion because deformation due to an environment is suppressed. The flexible substrate may be formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate 510 because its coefficient of linear expansion is low. Alternatively, a sheet, a film, or foil containing a fiber may be used as the substrate 510. The substrate 510 may have elasticity.

The following methods can be given as examples of a method for providing a transistor over a flexible substrate: (1) a transistor is formed over a flexible substrate; and (2) a transistor is formed over a non-flexible substrate, and then, an element layer in which the transistor is formed is separated from the non-flexible substrate and transferred to a flexible substrate. In the latter method, the element layer is preferably formed over a separation layer provided over the non-flexible substrate.

The element layer in which the transistor is formed may be provided between the substrate 510 and the insulating layer 511.

<Back Gate Electrode, Gate Electrode, Source Electrode, and Drain Electrode>

Each of the conductive layers 522 to 524 preferably has a single-layer structure or a stacked-layer structure including a conductive film containing a low-resistance material such as copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), or strontium (Sr), an alloy of the low-resistance material, or a compound containing such a material as its main component.

It is particularly preferable to use a high-melting-point material that has both heat resistance and conductivity, such as tungsten or molybdenum, or a low-resistance conductive material, such as aluminum or copper. Furthermore, a Cu—Mn alloy is preferably used, in which case manganese oxide formed at the interface with an insulator containing oxygen has a function of preventing Cu diffusion. A conductive oxide containing a noble metal, such as iridium oxide, ruthenium oxide, or strontium ruthenate, hardly extracts oxygen from an oxide semiconductor even when it is in contact with the oxide semiconductor. Therefore, the conductive oxide containing a noble metal is suitable as a material used for the conductive layers 523 and 524.

<Low-Resistance Region>

The regions 535 and 536 are formed in such a manner that the conductive layers 523 and 524 extract oxygen from the metal oxide layer 532, for example. Oxygen is more likely to be extracted at a higher temperature. Oxygen vacancies are formed in the regions 535 and 536 through several heating steps in the manufacturing process of the transistor 500. Furthermore, the heating makes hydrogen enter the sites of oxygen vacancies, increasing the carrier concentration in the regions 535 and 536. As a result, the resistance of the regions 535 and 536 is reduced.

<Insulating Layer>

The insulating layers 511 to 517 can each be formed using an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like, for example. The materials and layer structures of the insulating layers 511 to 517 may be determined in accordance with characteristics required for them.

In this specification and the like, an oxynitride refers to a compound that contains more oxygen than nitrogen, and a nitride oxide refers to a compound that contains more nitrogen than oxygen.

The insulating layer 514 preferably includes an insulator capable of supplying oxygen to the metal oxide layer 530. In particular, the insulating layer 514 preferably includes an insulator from which part of oxygen is released by heating. Oxygen released from the insulating layer 514 is supplied to the metal oxide layer 530, so that oxygen vacancies in the metal oxide layer 530 can be reduced. Consequently, a change in the electrical characteristics of the transistor 500 can be suppressed and the reliability can be improved.

For example, the insulating layer 514 may be formed using a metal oxide such as silicon oxide, silicon oxynitride, aluminum oxide, aluminum oxynitride, gallium oxide, gallium oxynitride, yttrium oxide, yttrium oxynitride, hafnium oxide, or hafnium oxynitride.

The insulating layer 514 may contain excess oxygen to supply to the metal oxide layer 530. For this purpose, the insulating layer 514 may be deposited in an oxygen atmosphere, for example. Alternatively, a region containing excess oxygen may be formed by introducing oxygen into the deposited insulating layer 514. These two methods may be combined.

For example, oxygen (including at least oxygen radicals, oxygen atoms, or oxygen ions) is introduced into the deposited insulating layer 514, so that a region containing excess oxygen is formed. Oxygen can be introduced by an ion implantation method, an ion doping method, a plasma immersion ion implantation method, plasma treatment, or the like. An oxygen-containing gas can be used for the oxygen introduction treatment. As the oxygen-containing gas, oxygen, nitrous oxide, nitrogen dioxide, carbon dioxide, or carbon monoxide can be used, for example. The oxygen-containing gas used for the oxygen introduction treatment may further contain a rare gas, hydrogen, or the like. For example, a mixed gas of carbon dioxide, hydrogen, and argon may be used. Furthermore, to increase the planarity of the top surface of the insulating layer 514, planarization treatment using a CMP method or the like may be performed after the insulating layer 514 is deposited.

The insulating layer 513 has a passivation function of preventing a decrease in the amount of oxygen contained in the insulating layer 514. Specifically, the insulating layer 513 prevents oxygen contained in the insulating layer 514 from being bonded to a metal contained in the conductive layer 522. The insulating layer 513 has a function of blocking oxygen, hydrogen, water, an alkali metal, an alkaline earth metal, or the like. The insulating layer 513 can prevent outward diffusion of oxygen from the metal oxide layer 530 and entry of hydrogen, water, or the like into the metal oxide layer 530 from the outside. The insulating layer 513 can be formed using an insulator containing a nitride, a nitride oxide, an oxide, or an oxynitride, for example. Examples of the insulator include silicon nitride, silicon nitride oxide, aluminum nitride, aluminum nitride oxide, aluminum oxide, aluminum oxynitride, gallium oxide, gallium oxynitride, yttrium oxide, yttrium oxynitride, hafnium oxide, and hafnium oxynitride.

The insulating layer 513 may include a charge accumulation layer. In this case, the threshold voltage of the transistor 500 can be controlled by injecting electrons into the insulating layer 513. An insulator that can be used for the charge accumulation layer contains, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, an insulating layer or a stack of insulating layers including one or more materials selected from aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide may be used.

The insulating layer 515, which serves as a gate insulating film, preferably includes an insulator with a high relative permittivity. For example, the insulating layer 515 is preferably formed using gallium oxide, hafnium oxide, an oxide containing aluminum and hafnium, an oxynitride containing aluminum and hafnium, an oxide containing silicon and hafnium, or an oxynitride containing silicon and hafnium.

The insulating layer 515 preferably has a stacked-layer structure including silicon oxide or silicon oxynitride and an insulator with a high relative permittivity. When silicon oxide or silicon oxynitride, which are thermally stable, is combined with an insulator with a high relative permittivity, the stacked-layer structure can have thermal stability and a high relative permittivity. For example, a layer containing aluminum oxide, gallium oxide, or hafnium oxide may be provided on the metal oxide layer 533 side to suppress entry of silicon contained in silicon oxide or silicon oxynitride into the metal oxide layer 532.

If the insulating layer 515 contains silicon oxide or silicon oxynitride on the metal oxide layer 533 side, for example, trap centers might be formed at the interface between aluminum oxide, gallium oxide, or hafnium oxide and silicon oxide or silicon oxynitride. The trap centers can shift the threshold voltage of the transistor in the positive direction by capturing electrons in some cases.

The insulating layer 516 preferably includes an insulator with a low relative permittivity. For example, the insulating layer 516 preferably includes silicon oxide, silicon oxynitride, silicon nitride oxide, silicon nitride, or a resin. Alternatively, the insulating layer preferably has a stacked-layer structure including silicon oxide or silicon oxynitride and a resin. When silicon oxide or silicon oxynitride, which are thermally stable, is combined with a resin, the stacked-layer structure can have thermal stability and a low relative permittivity. Examples of the resin include polyester, polyolefin, polyamide (e.g., nylon or aramid), polyimide, polycarbonate, and acrylic. Like the insulating layer 514, the insulating layer 516 preferably has a function of supplying oxygen to the metal oxide layer 530.

The insulating layer 517 is a passivation layer having a function of blocking oxygen, hydrogen, water, an alkali metal, an alkaline earth metal, or the like. The insulating layer 517 can prevent outward diffusion of oxygen from the metal oxide layer 530 and entry of hydrogen, water, or the like into the metal oxide layer 530 from the outside. An example of such an insulating layer having a passivation function is a layer including silicon nitride, silicon nitride oxide, aluminum nitride, aluminum nitride oxide, aluminum oxide, aluminum oxynitride, gallium oxide, gallium oxynitride, yttrium oxide, yttrium oxynitride, hafnium oxide, hafnium oxynitride, or the like. An aluminum oxide layer is favorably used as the insulating layer 517 because it is highly effective in preventing both oxygen and impurities such as hydrogen and moisture from permeating the film.

It is preferable to perform second heat treatment at any time after the deposition of the insulating layer 517. Through the second heat treatment, oxygen contained in the insulating layers 514 and 516 is diffused and reaches the metal oxide layer 530, whereby oxygen vacancies in the metal oxide layer 530 can be reduced. In the second heat treatment, the insulating layer 517 prevents upward diffusion of oxygen through the insulating layer 517, and the insulating layer 513 prevents downward diffusion of oxygen through the insulating layer 513; accordingly, oxygen can be efficiently supplied to the metal oxide layer 530.

Note that the second heat treatment may be performed at a temperature that allows oxygen contained in the insulating layers 514 and 516 to be diffused into the metal oxide layer 530. For example, the description of the first heat treatment can be referred to. The second heat treatment is preferably performed at a lower temperature than the first heat treatment. The temperature of the second heat treatment may be lower than that of the first heat treatment by 20° C. or more and 150° C. or less, preferably 40° C. or more and 100° C. or less. Accordingly, superfluous release of oxygen from the insulating layer 514 can be inhibited. In the case where heating at the time of deposition of a layer can double as the second heat treatment, the second heat treatment is not necessarily performed. As described above, oxygen can be supplied to the metal oxide layer 530 from above and below through the deposition of the insulating layer 517 and the second heat treatment. Alternatively, oxygen may be added to the insulating layers 514 and 516 by depositing a film containing indium oxide such as an In-M-Zn oxide as the insulating layer 517.

<<Structure Example 2 of Transistor>>

FIG. 16A is a top view of a transistor 501. FIG. 16B is a cross-sectional view taken along line x11-x12 in FIG. 16A, and FIG. 16C is a cross-sectional view taken along line y11-y12 in FIG. 16A. The transistor 501 has an s-channel structure like the transistor 500 and the like. In the transistor 501, an insulating layer 519 is provided in contact with a side surface of the conductive layer 521 that serves as a gate electrode. The insulating layer 519 serves as a sidewall insulating layer of the transistor 501.

Regions 541 to 544 are formed in the metal oxide layer 530. These regions have lower resistivities than another region (typically a region overlapping with the conductive layer 521). The regions 541 to 544 are formed in a self-aligned manner in an impurity addition step in which the conductive layer 521 and the insulating layer 519 are used as masks. The regions 541 to 544 are formed by adding a rare gas element (Ar, Xe, Kr, Ne, or He) to the metal oxide layer 530 with an ion implantation apparatus, an ion doping apparatus, a plasma doping apparatus, a plasma treatment apparatus, or the like. Hydrogen, nitrogen, boron, phosphorus, arsenic, tungsten, aluminum, or the like may be added as an impurity. The regions 541 and 542 have a lower resistivity than the regions 543 and 544.

<<Structure Example 3 of Transistor>>

Figure 17A:
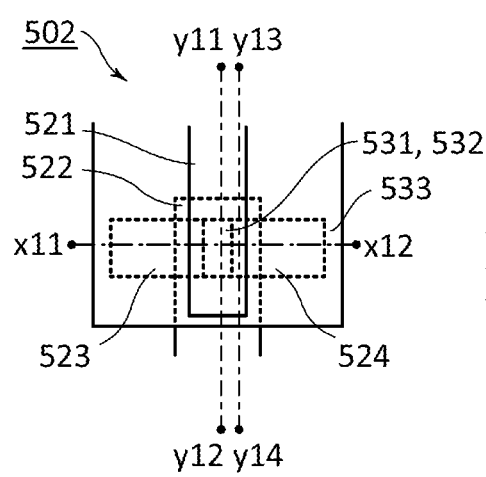
FIG. 17A is a top view illustrating a structure example of a transistor.
Figure 17B:
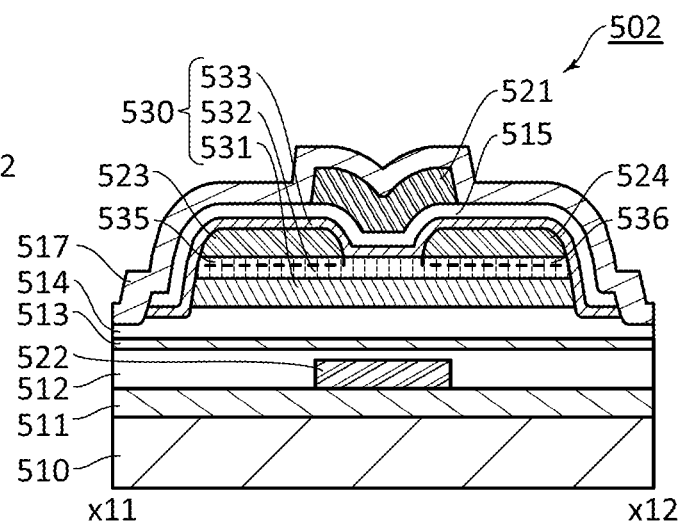
FIG. 17B is a cross-sectional view taken along line x11-x12 in FIG. 17A.
Figures 17C, 17D:
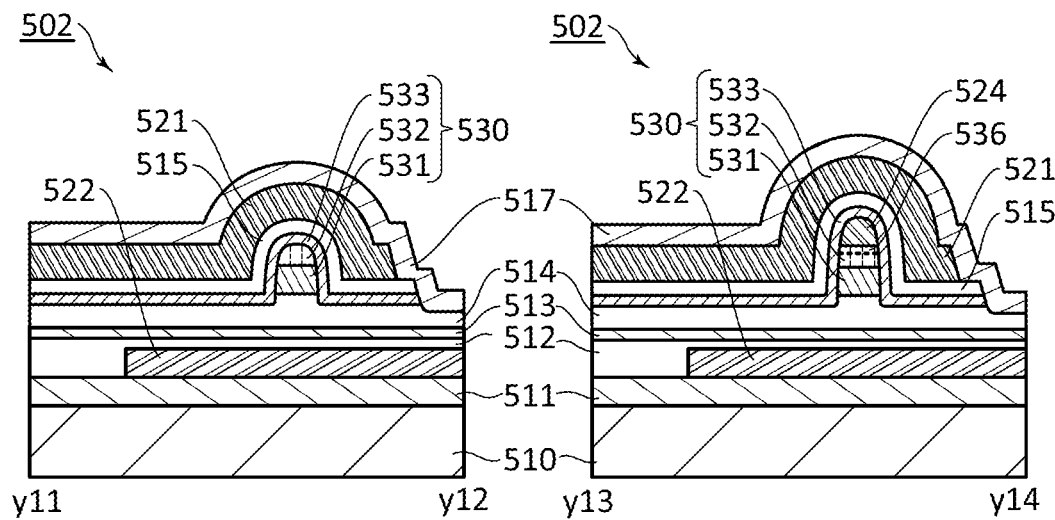
FIG. 17C is a cross-sectional view taken along line y11-y12 in FIG. 17A.
FIG. 17D is a cross-sectional view taken along line y13-y14 in FIG. 17A.

FIGS. 17A to 17D illustrate a structure example of a transistor. FIG. 17A is a top view illustrating a structure example of a transistor 502. FIGS. 17B, 17C, and 17D are cross-sectional views taken along lines x11-x12, y11-y12, and y13-y14, respectively, in FIG. 17A.

The metal oxide layer 533 is formed to cover the metal oxide layers 531 and 532 and the conductive layers 523 and 524. The insulating layer 515 covers the metal oxide layer 533. Here, the metal oxide layer 533 and the insulating layer 515 are etched using the same mask.

The transistor 502 has an s-channel structure like the transistor 500. In the transistor 500, the metal oxide layer 533, the insulating layer 515, and the conductive layer 521 are formed so as to fill the opening in the insulating layer 516; in contrast, the transistor 502 does not include the insulating layer 516. The opening in the insulating layer 516 enables the gate electrode of the transistor 500 to be formed in a self-aligned manner; therefore, the transistor 500 is suitable for miniaturization. The parasitic capacitance of the conductive layer 521 can be reduced in the transistor 500 as compared with that in the transistor 502.

The conductive layers 523 and 524 are formed using a hard mask used for forming the stack of the metal oxide layers 531 and 532. Therefore, the conductive layers 523 and 524 do not have regions in contact with the side surfaces of the metal oxide layers 531 and 532. For example, the metal oxide layers 531 and 532 and the conductive layers 523 and 524 can be formed through the following steps. A two-layer oxide semiconductor film to be the metal oxide layers 531 and 532 is formed. A single-layer or multilayer conductive film is formed over the oxide semiconductor film. This conductive film is etched to form a hard mask. With the use of this hard mask, the two-layer oxide semiconductor film is etched to form the stack of the metal oxide layers 531 and 532. Then, the hard mask is etched to form the conductive layers 523 and 524.

(Modification Example)

The transistors 500 to 502 may have a structure without the charge accumulation layer (the insulating layer 513). Furthermore, the transistors 500 to 502 may have a structure without the back gate electrode (the conductive layer 522). In this case, the insulating layers 512 and 513 are not necessarily provided.

(Embodiment 4)

In this embodiment, a semiconductor device having a device structure in which a Si transistor and an OS transistor are stacked will be described. Here, the device structure of the current generating circuit of Embodiment 1 will be shown as an example.

Figure 18A:
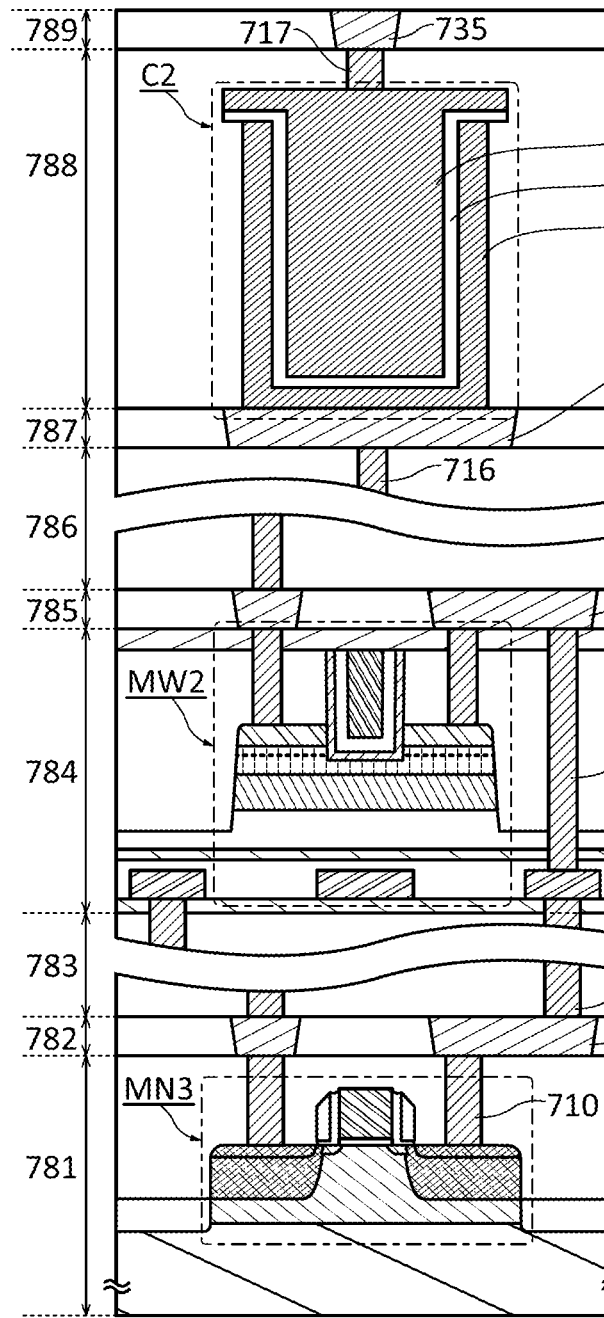
FIGS. 18A and 18B are cross-sectional views illustrating a structure example of a semiconductor device.
Figure 18B:
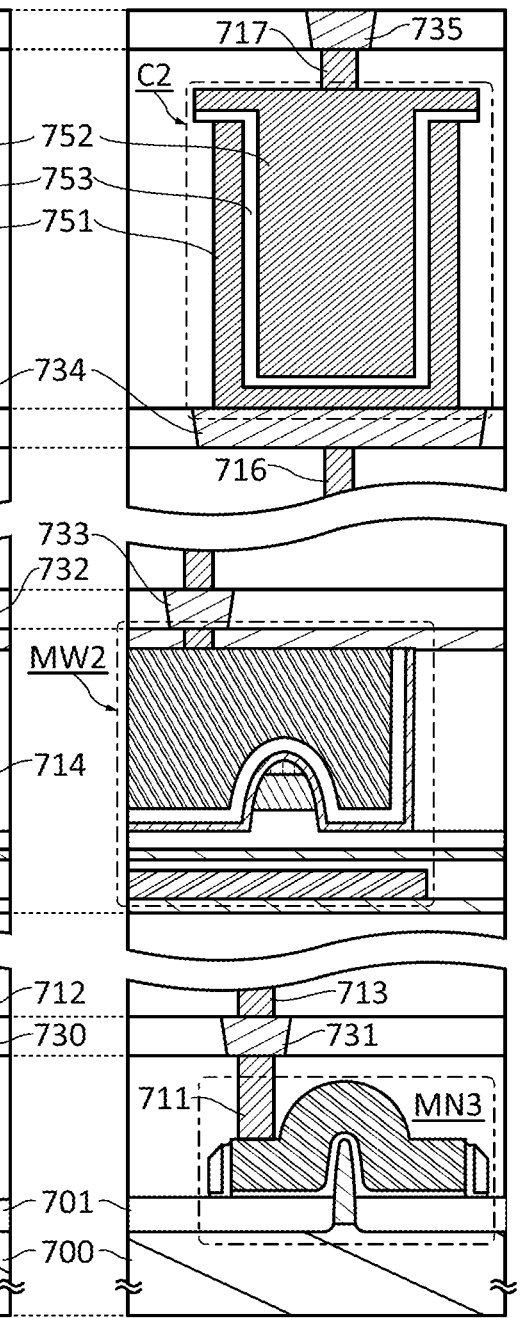

FIGS. 18A and 18B are cross-sectional views illustrating the device structure of the circuit 111, typically, the transistors MN3 and MW2 and the capacitor C2. FIG. 18A is a cross-sectional view in the channel length direction of the transistors included in the circuit 111, and FIG. 18B is a cross-sectional view in the channel width direction of the transistors. Note that FIGS. 18A and 18B illustrate the device structure of the circuit 111 and that the direction of the transistors included in the circuit 111 is not limited to the direction illustrated in the drawings.

The circuit 111 includes layers 781 to 789 in order from the bottom. The layer 781 includes a substrate 700, the transistor MN3 formed over the substrate 700, an element isolation layer 701, and a plurality of plugs such as plugs 710 and 711. The layer 781 is an element layer in which Si transistors such as the transistor MN3 are formed.

A substrate similar to the substrate 510 can be selected as the substrate 700. The substrate 700 is a single-crystal semiconductor substrate or a polycrystalline semiconductor substrate made of silicon or silicon carbide, a compound semiconductor substrate made of silicon germanium, an SOI substrate, or the like. Alternatively, the substrate 700 may also be a glass substrate, a quartz substrate, a plastic substrate, a metal substrate, a flexible substrate, an attachment film, paper containing a fibrous material, a base film, or the like. Alternatively, a semiconductor element may be formed using one substrate and then transferred to another substrate. Here, as an example, a single-crystal silicon wafer is used as the substrate 700.

Figure 19A:
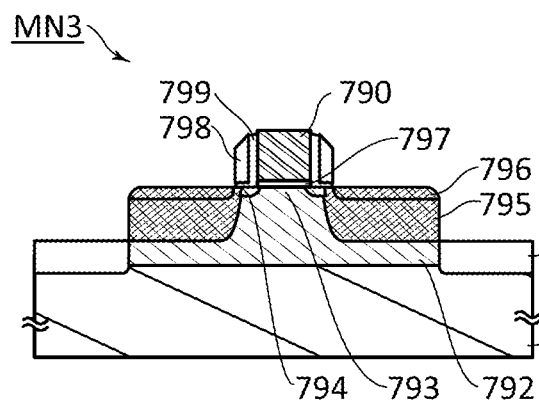
FIGS. 19A to 19D are cross-sectional views illustrating structure examples of a transistor.
Figure 19B:
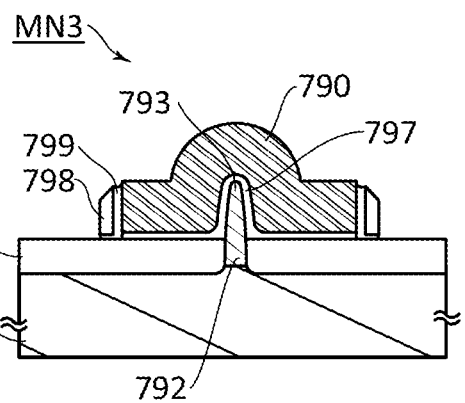

FIGS. 19A to 19D illustrate structure examples of the transistor MN3. FIG. 19A shows a cross-sectional view of the transistor MN3 in the channel length direction, and FIG. 19B shows a cross-sectional view of the transistor MN3 in the channel width direction. The transistor MN3 includes a channel formation region 793 provided in a well 792, a low concentration impurity region 794 and a high concentration impurity region 795 (collectively referred to simply as an impurity region), a conductive region 796 provided in contact with the impurity region, a gate insulating layer 797 provided over the channel formation region 793, a gate electrode 790 provided over the gate insulating layer 797, and sidewall insulating layers 798 and 799 provided on side surfaces of the gate electrode 790. The conductive region 796 may be formed using a metal silicide or the like.

The channel formation region 793 of the transistor MN3 has a projection, and the gate insulating layer 797 and the gate electrode 790 are provided along the side surfaces and the top surface of the channel formation region 793. A transistor having such a device structure is referred to as a FIN transistor. Although the case where the projecting is formed by processing part of the substrate 700 is described here, a semiconductor layer having a projection may be formed by processing an SOI substrate.

Figure 19C:
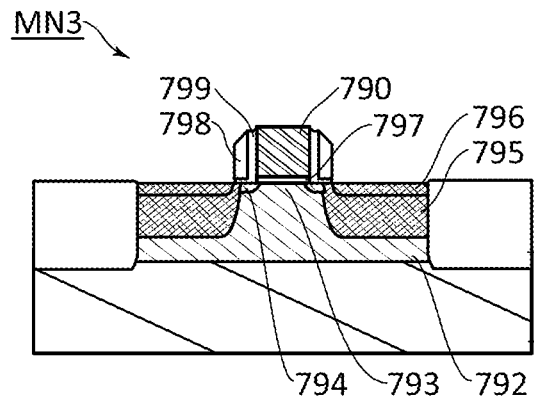
Figure 19D:
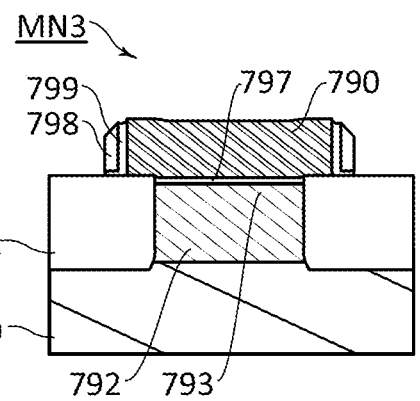

Note that the transistor MN3 is not limited to a FIN transistor and may be a planar transistor illustrated in FIGS. 19C and 19D, for example. FIG. 19C is a cross-sectional view of the transistor MN3 in the channel length direction, and FIG. 19D is a cross-sectional view of the transistor MN3 in the channel width direction.

The layer 782 includes a plurality of wirings such as wirings 730 and 731. The layer 783 includes a plurality of plugs such as plugs 712 and 713 and a plurality of wirings (not illustrated). Here, the transistor MW2 has a device structure similar to that of the transistor 500 (FIGS. 14A to 14C).

The layer 784 includes the transistor MW2 and a plurality of plugs such as a plug 714. The layer 784 is an element layer in which OS transistors such as the transistor MW2 are formed.

The layer 785 includes a plurality of wirings such as wirings 732 and 733. The layer 786 includes a plurality of plugs such as a plug 716 and a plurality of wirings (not illustrated). The layer 787 includes a plurality of wirings such as a wiring 734. The layer 788 includes the capacitor C2 and a plurality of plugs such as a plug 717. The layer 788 is an element layer in which the capacitors C1 and C2 in the circuit 111 are formed. The capacitor C2 includes an electrode 751, an electrode 752, and an insulating layer 753. The capacitor C1 has a device structure similar to that of the capacitor C2. The layer 789 includes a plurality of wirings such as a wiring 735.

Each of the wirings 730 to 735 and the plugs 710 to 714, 716, and 717 preferably has a single-layer structure or a stacked-layer structure including a conductive film containing a low-resistance material such as copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), or cobalt (Co), an alloy of the low-resistance material, or a compound containing such a material as its main component. It is particularly preferable to use a high-melting-point material that has both heat resistance and conductivity, such as tungsten or molybdenum, or a low-resistance conductive material, such as aluminum or copper. Furthermore, a Cu—Mn alloy is preferably used, in which case manganese oxide formed at the interface with an insulator containing oxygen has a function of preventing Cu diffusion.

In FIGS. 18A and 18B, a region without a reference numeral or a hatch pattern is formed of an insulator. As the insulator, an insulator containing at least one material selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, the region can also be formed using a resin such as a polyimide resin, a polyamide resin, an acrylic resin, a siloxane resin, an epoxy resin, or a phenol resin.

(Embodiment 5)

In this embodiment, the structure of an oxide semiconductor will be described. An oxide semiconductor is classified into a single-crystal oxide semiconductor and a non-single-crystal oxide semiconductor. Examples of the non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor. From another perspective, an oxide semiconductor is classified into an amorphous oxide semiconductor and a crystalline oxide semiconductor. Examples of the crystalline oxide semiconductor include a single-crystal oxide semiconductor, a CAAC-OS, a polycrystalline oxide semiconductor, and an nc-OS.

In general, an amorphous structure is thought to be isotropic and have no non-uniform structure, to be metastable and have no fixed atomic arrangement, to have a flexible bond angle, and to have a short-range order but have no long-range order, for example. In other words, neither a stable oxide semiconductor nor an oxide semiconductor that is not isotropic (e.g., an oxide semiconductor that has a periodic structure in a microscopic region) cannot be regarded as a completely amorphous oxide semiconductor. An a-like OS, which is not isotropic, has an unstable structure that includes a void. Because of its instability, an a-like OS has physical properties similar to those of an amorphous oxide semiconductor.

<CAAC-OS>

A CAAC-OS is one of oxide semiconductors and has a plurality of c-axis aligned crystal parts (also referred to as pellets).

(XRD)

Analysis of a CAAC-OS by X-ray diffraction (XRD) will be described. For example, when the structure of a CAAC-OS including an InGaZnO$_4$ crystal, which is classified into the space group R-3m, is analyzed by an out-of-plane method, a peak appears at a diffraction angle (2θ) of around 31°. This peak is derived from the (009) plane of the InGaZnO$_4$ crystal, which indicates that crystals in the CAAC-OS have c-axis alignment and that the c-axes are aligned in the direction substantially perpendicular to a surface over which the CAAC-OS is formed (also referred to as a formation surface) or a top surface of the CAAC-OS. Note that a peak sometimes appears at 2θ of around 36° in addition to the peak at 2θ of around 31°. The peak at 2θ of around 36° is attributed to a crystal structure classified into the space group Fd-3m; thus, this peak is preferably not exhibited in the CAAC-OS.

In structural analysis of the CAAC-OS by an in-plane method in which an X-ray is incident on the CAAC-OS in the direction parallel to the formation surface, a peak appears at 2θ of around 56°. This peak is derived from the (110) plane of the InGaZnO$_4$ crystal. When analysis (φ scan) is performed with 2θ fixed at around 56° while the sample is rotated around a normal vector to the sample surface as an axis (φ axis), a peak is not clearly observed. In the case where single-crystal InGaZnO$_4$ is subjected to φ scan with 2θ fixed at around 56°, six peaks which are derived from crystal planes equivalent to the (110) plane are observed. Accordingly, the structural analysis using XRD confirms that the directions of the a-axes and b-axes are irregularly oriented in the CAAC-OS.

(Electron Diffraction)

For example, when an electron beam with a probe diameter of 300 nm is incident on a CAAC-OS including an InGaZnO$_4$ crystal in the direction parallel to the formation surface of the CAAC-OS, a diffraction pattern (also referred to as a selected-area electron diffraction pattern) can be obtained. This diffraction pattern includes spots derived from the (009) plane of the InGaZnO$_4$ crystal. Thus, the results of electron diffraction also indicate that pellets included in the CAAC-OS have c-axis alignment and that the c-axes are aligned in the direction substantially perpendicular to the formation surface or the top surface of the CAAC-OS. A ring-like diffraction pattern is observed when an electron beam with a probe diameter of 300 nm is perpendicularly incident on the sample surface. Thus, the results of electron diffraction using an electron beam with a probe diameter of 300 nm can confirm that the a-axes and b-axes of the crystal parts included in the CAAC-OS do not have regular alignment.

(High-Resolution TEM Image)

In a combined analysis image (also referred to as a transmission electron microscope (TEM) image) of a bright-field image and a diffraction pattern of a CAAC-OS, which is obtained using a TEM, a plurality of crystal parts can be observed. However, even in the high-resolution TEM image, a boundary between crystal parts, that is, a grain boundary is not clearly observed in some cases. Thus, in the CAAC-OS, a reduction in electron mobility due to the grain boundary is less likely to occur. To observe a high-resolution TEM image, a spherical aberration corrector function is preferably used. Here, a high-resolution TEM image obtained with a spherical aberration corrector function is referred to as a Cs-corrected high-resolution TEM image.

From a high-resolution cross-sectional TEM image of the CAAC-OS observed in the direction substantially parallel to the sample surface, a crystal part in which metal atoms are arranged in a layered manner can be identified. A crystal part with a size of 1 nm or more and a crystal part with a size of 3 nm or more are observed. Therefore, the crystal part can also be referred to as a nanocrystal (nc). Furthermore, the CAAC-OS can also be referred to as an oxide semiconductor including c-axis aligned nanocrystals (CANC). A crystal part reflects unevenness of a formation surface or a top surface of the CAAC-OS and is parallel to the formation surface or the top surface of the CAAC-OS.

Image processing on a Cs-corrected high-resolution plan-view TEM image of the CAAC-OS observed in the direction substantially perpendicular to the sample surface demonstrates that a crystal part has a hexagonal configuration. Note that the shape of the crystal part is not always a regular hexagon but is a non-regular hexagon in many cases. The image processing is performed as follows.

A Cs-corrected high-resolution TEM image is subjected to fast Fourier transform (FFT), so that an FFT image is obtained. Mask processing is performed on the obtained FFT image such that part in the range from 2.8 nm$^{-1}$ to 5.0 nm$^{-1}$ from the reference point is left. The FFT image subjected to mask processing undergoes inverse fast Fourier transform (IFFT) to obtain an image (FFT filtered image). The FFT filtered image is a Cs-corrected high-resolution TEM image from which a periodic component is extracted to show a lattice arrangement.

In the obtained FFT filtered image, no clear grain boundary is observed. The reason why a distorted hexagonal crystal part exists is that distortion of a lattice arrangement suppresses formation of a grain boundary. This is probably because the following features of the CAAC-OS can allow distortion: a low density of the atomic arrangement in the a-b plane direction, an interatomic bond distance changed by substitution of a metal element, and the like.

As described above, the CAAC-OS has c-axis alignment, includes crystal parts (nanocrystals) connected in the a-b plane direction, and has a crystal structure with distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has few impurities and defects (e.g., oxygen vacancies).

An impurity means an element other than the main components of an oxide semiconductor, such as hydrogen, carbon, silicon, or a transition metal element. For example, an element (e.g., silicon) having stronger bonding force to oxygen than a metal element contained in an oxide semiconductor extracts oxygen from the oxide semiconductor, which results in a disordered atomic arrangement and reduced crystallinity of the oxide semiconductor. A heavy metal such as iron or nickel, argon, carbon dioxide, or the like has a large atomic radius (or molecular radius) and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, an oxygen vacancy in the oxide semiconductor might serve as a carrier trap or serve as a carrier generation source when hydrogen is captured therein.

The CAAC-OS having few impurities and oxygen vacancies is an oxide semiconductor with a low carrier density (specifically, lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be regarded as an oxide semiconductor having stable characteristics.

<nc-OS>

(XRD)

When the structure of an nc-OS is analyzed by an out-of-plane method, no peak indicating orientation appears. That is, a crystal of an nc-OS does not have orientation. For example, when an electron beam with a probe diameter of 50 nm is incident on a 34-nm-thick region of a thinned nc-OS including an InGaZnO$_4$ crystal in the direction parallel to the formation surface, a ring-like diffraction pattern is observed. When an electron beam with a probe diameter of 1 nm is incident on the same sample, a plurality of spots is observed in the ring-like region. Thus, ordering in an nc-OS is not observed with an electron beam with a probe diameter of 50 nm but is observed with an electron beam with a probe diameter of 1 nm.

When an electron beam with a probe diameter of 1 nm is incident on a region with a thickness less than 10 nm, an electron diffraction pattern in which spots are arranged in an approximately regular hexagonal shape is observed in some cases. This means that an nc-OS has a well-ordered region, that is, a crystal, in the thickness range of less than 10 nm. Note that no electron diffraction pattern having regularity is observed in some regions because crystals are oriented in various directions.

(High-resolution TEM Image)

In a Cs-corrected high-resolution cross-sectional TEM image of the nc-OS, a region in which a crystal part is observed and a region in which no clear crystal part is observed can be identified. In most cases, the size of a crystal part included in the nc-OS is greater than or equal to 1 nm and less than or equal to 10 nm, specifically greater than or equal to 1 nm and less than or equal to 3 nm. Note that an oxide semiconductor including a crystal part whose size is greater than 10 nm and less than or equal to 100 nm may be referred to as a microcrystalline oxide semiconductor. In a high-resolution TEM image, a grain boundary of the nc-OS is not clearly observed in some cases. Note that there is a possibility that the origin of the nanocrystal is the same as that of a crystal part in a CAAC-OS. Therefore, a crystal part of the nc-OS may be referred to as a pellet in the following description.

As described above, in the nc-OS, a microscopic region (e.g., a region with a size greater than or equal to 1 nm and less than or equal to 10 nm, specifically, a region with a size greater than or equal to 1 nm and less than or equal to 3 nm) has a periodic atomic arrangement. There is no regularity of crystal orientation between different crystal parts in the nc-OS. Thus, the orientation of the whole film is not observed. Accordingly, in some cases, the nc-OS cannot be distinguished from an a-like OS or an amorphous oxide semiconductor, depending on the analysis method. Since there is no regularity of crystal orientation between the crystal parts (nanocrystals), the nc-OS can also be referred to as an oxide semiconductor including random aligned nanocrystals (RANC) or an oxide semiconductor including non-aligned nanocrystals (NANC).

The structure of the nc-OS has higher regularity than that of an amorphous oxide semiconductor. Therefore, the nc-OS has a lower density of defect states than the a-like OS and the amorphous oxide semiconductor. However, there is no regularity of crystal orientation between different crystal parts in the nc-OS; hence, the nc-OS has a higher density of defect states than the CAAC-OS.

<a-Like OS>

An a-like OS has a structure between the structure of an nc-OS and the structure of an amorphous oxide semiconductor. For example, the structure of the a-like OS has lower regularity than that of the nc-OS but has higher regularity than that of an amorphous oxide semiconductor. The a-like OS has an unstable structure as compared with the nc-OS and the CAAC-OS. The a-like OS has a lower density than the nc-OS and the CAAC-OS. This is because the a-like OS has a void (low-density region). A void can be observed in a high-resolution cross-sectional TEM image.

The density of the a-like OS is higher than or equal to 78.6% and lower than 92.3% of the density of the single-crystal oxide semiconductor having the same composition. The density of the nc-OS and the density of the CAAC-OS are each higher than or equal to 92.3% and lower than 100% of the density of the single-crystal oxide semiconductor having the same composition. It is difficult to deposit an oxide semiconductor having a density lower than 78% of the density of the single-crystal oxide semiconductor.

For example, the density of single-crystal InGaZnO$_4$ with a rhombohedral crystal structure is 6.357 g/cm$^3$. Accordingly, in the case of an oxide semiconductor having an atomic ratio of In:Ga:Zn=1:1:1, the density of the a-like OS is higher than or equal to 5.0 g/cm$^3$ and lower than 5.9 g/cm$^3$ and the density of each of the nc-OS and the CAAC-OS is higher than or equal to 5.9 g/cm$^3$ and lower than 6.3 g/cm$^3$.

In the case where an oxide semiconductor having a certain composition does not exist in a single-crystal state, single-crystal oxide semiconductors with different compositions are combined at an adequate ratio, which makes it possible to calculate a density equivalent to that of a single-crystal oxide semiconductor with the desired composition. For example, a weighted average of the density of single crystal oxide semiconductors with different compositions can be calculated on the basis of the combination ratio of these single crystals. Note that it is preferable to use as few kinds of single-crystal oxide semiconductors as possible to calculate the density.

As described above, oxide semiconductors have various structures and various properties. For example, an oxide semiconductor film used for a semiconductor device such as an OS transistor may be a single-layer film of a CAAC-OS, an nc-OS, an a-like OS, or an amorphous oxide semiconductor or a multilayer film of oxide semiconductors with different structures.

Information about this specification and the like will be described below. In this specification, terms for explaining arrangement, such as "over" and "under", are sometimes used for convenience to describe the positional relation between components with reference to drawings. The positional relation between components is changed as appropriate in accordance with the direction in which the components are described. Thus, the positional relation is not limited by a term used in the specification and can be described with another term as appropriate depending on the circumstances.

In this specification and the like, the terms "film" and "layer" can be interchanged with each other depending on the case or circumstances. For example, in some cases, the term "conductive film" can be used instead of the term "conductive layer", and the term "insulating layer" can be used instead of the term "insulating film".

A voltage usually refers to a potential difference between a given potential and a reference potential (e.g., a ground potential or a source potential). Thus, a voltage can be referred to as a potential. Note that a potential has a relative value. Accordingly, "ground potential (GND)" does not necessarily mean 0 V.

In the drawings, the size, the layer thickness, or the region is exaggerated for clarity in some cases. Therefore, one embodiment of the present invention is not limited to such a scale. Note that the drawings schematically show ideal examples, and one embodiment of the present invention is not limited to a shape or a value shown in the drawings. For example, variation in signal, voltage, or current due to noise or difference in timing can be included.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification and the like, trigonal and rhombohedral crystal systems are included in a hexagonal crystal system.

This application is based on Japanese Patent Application serial no. 2015-127200 filed with Japan Patent Office on Jun. 25, 2015, the entire contents of which are hereby incorporated by reference.

What is claimed is:

1. A circuit comprising:
   an output terminal;
   a current mirror circuit comprising a first transistor and a second transistor;
   a third transistor;
   a switch;

a first memory circuit; and
a second memory circuit,
wherein a first voltage is input to a first terminal of the first transistor and a first terminal of the second transistor,
wherein a second voltage is input to a first terminal of the third transistor,
wherein a reference current is input to a second terminal of the first transistor,
wherein a second terminal of the second transistor and a second terminal of the third transistor are electrically connected to each other,
wherein the switch is configured to control an electrical connection between the second terminal of the second transistor and the output terminal,
wherein a third voltage stored in the first memory circuit is input to a gate of the second transistor, and
wherein a fourth voltage stored in the second memory circuit is input to a gate of the third transistor.

2. The circuit according to claim 1,
wherein the first memory circuit comprises a first capacitor and a fourth transistor,
wherein the first capacitor is electrically connected to the gate of the second transistor,
wherein the fourth transistor is configured to bring the gate of the second transistor into an electrically floating state,
wherein the second memory circuit comprises a second capacitor and a fifth transistor,
wherein the second capacitor is electrically connected to the gate of the third transistor, and
wherein the fifth transistor is configured to bring the gate of the third transistor into an electrically floating state.

3. The circuit according to claim 2,
wherein a first terminal of the fourth transistor is electrically connected to a gate of the first transistor, and
wherein a second terminal of the fourth transistor is electrically connected to the gate of the second transistor.

4. The circuit according to claim 2,
wherein a first terminal of the fourth transistor is electrically connected to the second terminal of the first transistor, and
wherein a second terminal of the fourth transistor is electrically connected to a gate of the first transistor and the gate of the second transistor.

5. The circuit according to claim 2, wherein a channel formation region of the fourth transistor and a channel formation region of the fifth transistor each comprise an oxide semiconductor.

6. The circuit according to claim 2,
wherein a first terminal of the fifth transistor is electrically connected to the gate of the third transistor, and
wherein a second terminal of the fifth transistor is electrically connected to the second terminal of the third transistor.

7. The circuit according to claim 6,
wherein a first terminal of the fourth transistor is electrically connected to a gate of the first transistor, and
wherein a second terminal of the fourth transistor is electrically connected to the gate of the second transistor.

8. The circuit according to claim 6,
wherein a first terminal of the fourth transistor is electrically connected to the second terminal of the first transistor, and
wherein a second terminal of the fourth transistor is electrically connected to a gate of the first transistor and the gate of the second transistor.

9. The circuit according to claim 3, wherein a channel formation region of the fourth transistor and a channel formation region of the fifth transistor each comprise an oxide semiconductor.

10. The circuit according to claim 1, further comprising a sixth transistor,
wherein the first voltage is input to a first terminal of the sixth transistor, and
wherein a second terminal of the sixth transistor is electrically connected to the second terminal of the first transistor.

11. The circuit according to claim 1, wherein the input of the reference current to the second terminal of the first transistor is stopped when a current is output from the output terminal.

12. A semiconductor device comprising a signal processing circuit executing orthogonal transform,
wherein the signal processing circuit comprises a multiplier circuit and the circuit according to claim 1, and
wherein an output of the circuit is input to the multiplier circuit.

13. A semiconductor device comprising a decoder and a display device,
wherein the decoder comprises a multiplier circuit and the circuit according to claim 1, and
wherein an output of the circuit is input to the multiplier circuit.

14. A semiconductor device comprising an encoder,
wherein the encoder comprises a multiplier circuit and the circuit according to claim 1, and
wherein an output of the circuit is input to the multiplier circuit.

15. A method for driving a circuit, the circuit comprising:
an output terminal;
a current mirror circuit comprising a first transistor and a second transistor;
a third transistor;
a switch;
a first memory circuit; and
a second memory circuit,
wherein a first voltage is input to a first terminal of the first transistor and a first terminal of the second transistor,
wherein a second voltage is input to a first terminal of the third transistor,
wherein a reference current is input to a second terminal of the first transistor,
wherein a second terminal of the second transistor and a second terminal of the third transistor are electrically connected to each other,
wherein the switch is configured to control an electrical connection between the second terminal of the second transistor and the output terminal,
wherein a third voltage stored in the first memory circuit is input to a gate of the second transistor, and
wherein a fourth voltage stored in the second memory circuit is input to a gate of the third transistor,
the method for driving the circuit comprising steps of:
a first step in which a gate voltage of the third transistor at the time when a first reference current is input to the second terminal of the first transistor is stored in the second memory circuit;
a second step which follows the first step and in which a gate voltage of the second transistor at the time when a second reference current is input to the second terminal of the first transistor is stored in the first memory circuit; and a third step which follows the second step and in which, in a state in which the input of the reference current to the second terminal of the first transistor is stopped, the switch is turned on so that a current is output from the output terminal.

16. A semiconductor device comprising:

a circuit comprising:
- a first transistor;
- a second transistor;
- a third transistor;
- a fourth transistor;
- a fifth transistor;
- a first capacitor;
- a second capacitor; and
- a switch, wherein a first voltage is input to a first terminal of the first transistor, wherein the first voltage is input to a first terminal of the second transistor, wherein a second voltage is input to a first terminal of the third transistor, wherein a reference current is input to a second terminal of the first transistor, wherein a second terminal of the second transistor is electrically connected to a second terminal of the third transistor, wherein the switch is configured to control an electrical connection between the second terminal of the second transistor and an output terminal of the circuit, wherein a gate of the first transistor is electrically connected to the second terminal of the first transistor, wherein a first terminal of the fourth transistor is electrically connected to a gate of the first transistor, wherein a second terminal of the fourth transistor is electrically connected to a gate of the second transistor, wherein a first electrode of the first capacitor is electrically connected to the gate of the second transistor, wherein a second electrode of the first capacitor is electrically connected to the first terminal of the second transistor, wherein a first terminal of the fifth transistor is electrically connected to a gate of the third transistor, wherein a second terminal of the fifth transistor is electrically connected to the second terminal of the third transistor, wherein a first electrode of the second capacitor is electrically connected to the gate of the third transistor, and wherein a second electrode of the second capacitor is electrically connected to the first terminal of the third transistor.

17. The semiconductor device according to claim 16, wherein a channel formation region of the fourth transistor and a channel formation region of the fifth transistor each comprise an oxide semiconductor.

* * * * *